United States Patent
Nakanishi et al.

(10) Patent No.: US 7,020,366 B2
(45) Date of Patent: Mar. 28, 2006

(54) LIGHT EMITTING DEVICE, OPTICAL MODULE, AND GRATING CHIP

(75) Inventors: Hiromi Nakanishi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 182 days.

(21) Appl. No.: 10/637,959

(22) Filed: Aug. 8, 2003

(65) Prior Publication Data

US 2004/0033032 A1   Feb. 19, 2004

(30) Foreign Application Priority Data

Aug. 12, 2002  (JP) ............................. P2002-234961

(51) Int. Cl.
 G02B 6/34   (2006.01)
 G02B 6/26   (2006.01)
 G02B 6/42   (2006.01)

(52) U.S. Cl. ............................. 385/37; 385/15; 385/31; 385/38; 385/39; 385/88; 385/89; 385/92; 398/135; 398/139; 398/140; 398/141

(58) Field of Classification Search ............. 385/14–15, 385/31, 37–39, 49–51, 88–94; 398/135, 398/139–141, 156

See application file for complete search history.

(56) References Cited

U.S. PATENT DOCUMENTS

| | | | | |
|---|---|---|---|---|
| 5,511,083 A | * | 4/1996 | D'Amato et al. ............... 372/6 |
| 5,546,481 A | * | 8/1996 | Meltz et al. .................... 385/11 |
| 5,717,804 A | * | 2/1998 | Pan et al. ....................... 385/94 |
| 5,724,377 A | * | 3/1998 | Huang ............................ 372/98 |
| 5,732,170 A | * | 3/1998 | Okude et al. .................. 385/27 |
| 5,771,250 A | * | 6/1998 | Shigehara et al. ............. 372/6 |
| 5,812,716 A | * | 9/1998 | Ohishi ........................... 385/92 |
| 5,844,927 A | * | 12/1998 | Kringlebotn .................... 372/6 |
| 5,930,430 A | * | 7/1999 | Pan et al. ....................... 385/94 |
| 5,993,073 A | * | 11/1999 | Hamakawa et al. .......... 385/88 |
| 5,995,692 A | * | 11/1999 | Hamakawa et al. .......... 385/49 |
| 6,061,172 A | * | 5/2000 | Naito et al. ............. 359/337.21 |
| 6,257,772 B1 | * | 7/2001 | Nakanishi et al. ............ 385/89 |
| 6,273,620 B1 | * | 8/2001 | Kato et al. .................... 385/88 |
| 6,282,351 B1 | * | 8/2001 | Go et al. ....................... 385/92 |

(Continued)

FOREIGN PATENT DOCUMENTS

JP   06-005961   1/1994

(Continued)

OTHER PUBLICATIONS

Bird, D.M., et al., "Narrow line semiconductor laser using fibre grating", *Electronic Letters*, 27(13):1115-1116 (1991).

*Primary Examiner*—Frank G. Font
*Assistant Examiner*—Ryan Lepisto
(74) *Attorney, Agent, or Firm*—Fish & Richardson P.C.

(57) ABSTRACT

A light emitting device has a fiber stub component, a grating chip, a semiconductor optical amplifier, a photodiode, and a mount member. The fiber stub component is comprised of a ferrule and an optical fiber. The fiber stub component, grating chip, and semiconductor optical amplifier are mounted on the mount member and are optically coupled to each other. An optical cavity is comprised of a light reflecting surface of the semiconductor optical amplifier and a diffraction grating of the grating chip. In this configuration, the light emitting device can provide laser light of a desired wavelength, without use of a pigtail fiber. The light emitting device can be constructed in smaller size than those using the pigtail fiber.

10 Claims, 18 Drawing Sheets

U.S. PATENT DOCUMENTS

| | | | |
|---|---|---|---|
| 6,310,997 B1 * | 10/2001 | Kato et al. | 385/37 |
| 6,314,220 B1 * | 11/2001 | Mossberg et al. | 385/37 |
| 6,318,908 B1 * | 11/2001 | Nakanishi et al. | 385/89 |
| 6,377,742 B1 * | 4/2002 | Go | 385/134 |
| 6,435,734 B1 * | 8/2002 | Okada et al. | 385/88 |
| 6,445,858 B1 * | 9/2002 | Musk | 385/52 |
| 6,459,710 B1 * | 10/2002 | Whitney et al. | 372/29.02 |
| 6,513,993 B1 * | 2/2003 | Nakanishi et al. | 385/92 |
| 6,530,698 B1 * | 3/2003 | Kuhara et al. | 385/88 |
| 6,618,405 B1 * | 9/2003 | Kimura et al. | 372/36 |
| 6,693,304 B1 * | 2/2004 | Nakanishi et al. | 257/81 |
| 6,697,414 B1 * | 2/2004 | Kato et al. | 372/102 |
| 6,726,376 B1 * | 4/2004 | Nakanishi et al. | 385/92 |
| 6,792,008 B1 * | 9/2004 | Wolak et al. | 372/6 |
| 6,792,012 B1 * | 9/2004 | Wolak et al. | 372/29.02 |
| 6,808,316 B1 * | 10/2004 | Nakanishi et al. | 385/88 |
| 6,837,627 B1 * | 1/2005 | Nakanishi et al. | 385/92 |
| 2002/0085596 A1 * | 7/2002 | Irie et al. | 372/36 |
| 2002/0094146 A1 * | 7/2002 | Yamaguchi | 385/2 |
| 2002/0122454 A1 * | 9/2002 | Nasu et al. | 372/102 |
| 2002/0168153 A1 * | 11/2002 | Yamabayashi et al. | 385/88 |
| 2002/0195611 A1 * | 12/2002 | Yamabayashi et al. | 257/98 |

FOREIGN PATENT DOCUMENTS

WO     WO 94/22187     9/1994

* cited by examiner

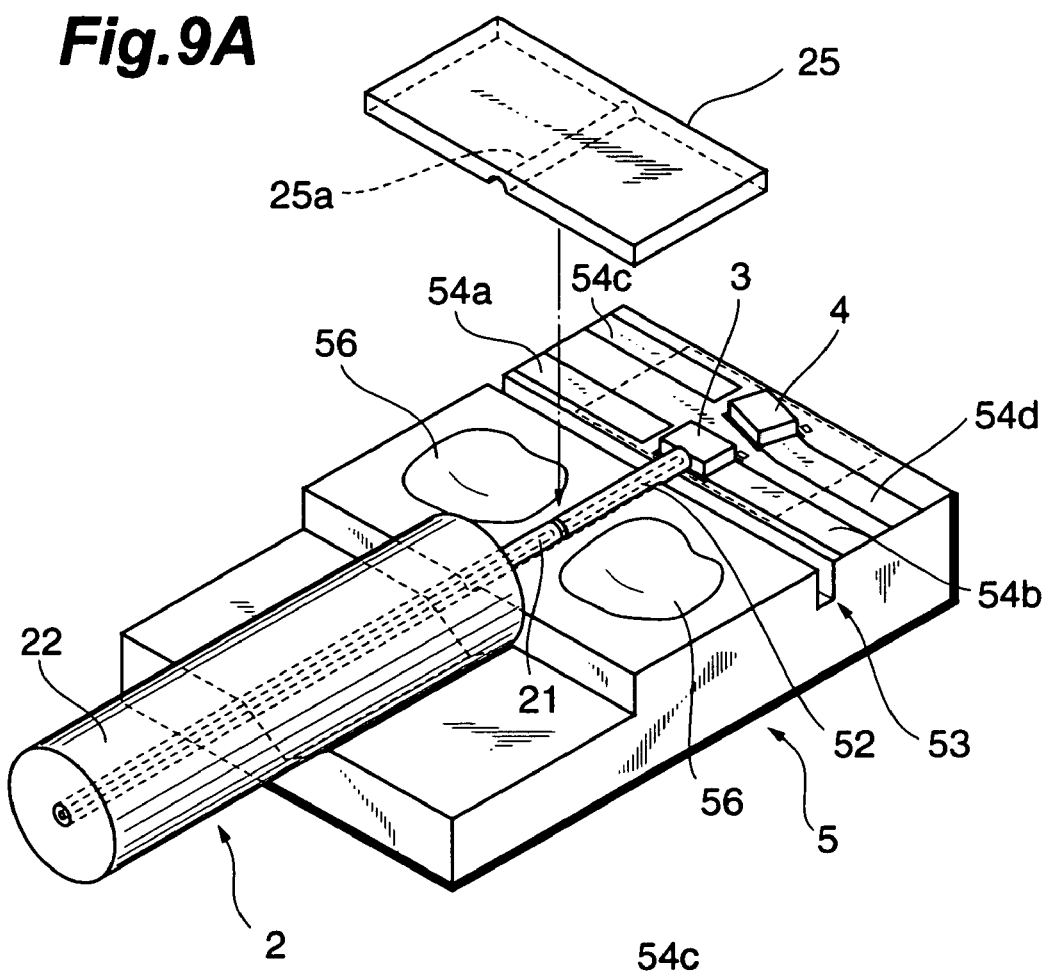
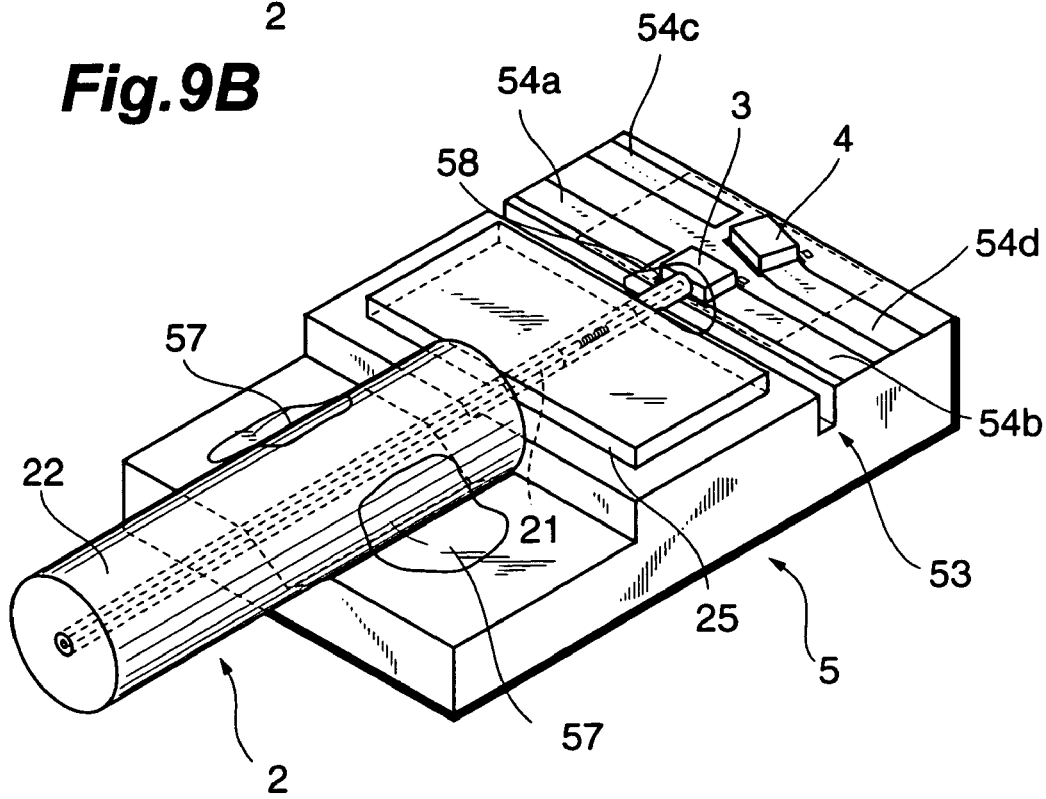

LIGHT EMITTING DEVICE, OPTICAL MODULE, AND GRATING CHIP

BACKGROUND OF THE INVENTION

1. Field of the Invention

The present invention relates to a light emitting device, an optical module, and a grating chip.

2. Related Background Art

Light emitting modules are commonly used in order to generate signal light launched into optical fibers constituting optical transmission lines of optical communication systems. The light emitting modules are generally provided with a semiconductor laser device for generating signal light, and an optical system including a lens for guiding the signal light into an optical fiber. The semiconductor laser device applied is a Fabry-Perot semiconductor laser device or a DFB semiconductor laser device. There are also light emitting modules using an external cavity type semiconductor laser system. In the external cavity semiconductor laser system, an optical cavity is comprised of a semiconductor optical element and a Bragg diffraction grating.

Examples of the light emitting devices with the external cavity type semiconductor laser system are described, for example, in Document 1 ("Electronics Letters Jun. 20, 1991 vol. 27 No. 13, pp.1115–1116"), Document 2 (Japanese Patent Application Laid-Open No. 06-5961), and Document 3 (WO94/22187).

Particularly, the light emitting device described in Document 1 is comprised of a grating fiber component and a semiconductor optical element. This grating fiber component has a detachable connector and is coupled through the connector to a package. In this structure of the light emitting device, it is easy to fabricate the light emitting device that generates light of different wavelengths. The first step is to prepare several types of grating fiber components with diffraction gratings of different reflection wavelengths in advance. A grating fiber component of a desired reflection wavelength is selected out of these components and is mounted in the package. This permits the optical module to emit light of the desired wavelength.

SUMMARY OF THE INVENTION

The Inventors conducted research on the above prior art and found problems as described below. Namely, the above grating fiber components need to have some length and thus are often disadvantageous in handling. Particularly, it is necessary to secure a region for housing the grating fiber component, and thus there arises a problem that it is hard to construct an optical transmitter incorporating the light emitting device of this type in compact size, for example. According to Inventor's knowledge, the package of the type described in the same Document tends to become large in scale, which is not preferable in terms of compactification of the optical transmitter. Furthermore, a diffraction grating is formed in each optical fiber of a predetermined length, which raises a problem of low mass productivity.

Document 2 also discloses the optical module adopting the external cavity type semiconductor laser system. In this optical module, a pigtail fiber of some length extends out of the package of the optical module. When such light emitting devices are mounted on a circuit board, the pigtail fibers are rolled up and mounted on the circuit board. Namely, it is necessary to secure a region for mounting the rolled pigtail fibers on the circuit board. It is important to compactify the circuit board, for example, in the optical communication systems like LAN (Local Area Network) and it is desirable in certain fields to decrease the size of the above mounting region.

A first object of the present invention is therefore to provide a light emitting device of structure enabling decrease in the size of the mounting region for the pigtail fiber when mounted on the circuit board. A second object of the present invention is to enable fiber stub components with various reflection wavelengths to be fabricated with high mass productivity and to provide light emitting devices of different oscillation wavelengths with high mass productivity.

A light emitting device according to the present invention comprises (a) a grating chip having a first end face, a second end face, and a diffraction grating; (b) a semiconductor optical amplifier having a light emitting surface and a light reflecting surface and being optically coupled to the first end face of the grating chip; (c) a fiber stub component including an optical fiber having a pair of end faces and being optically coupled to the second end face of the grating chip, and a ferrule having a pair of end faces; and (d) a mount member having first, second, and third regions arranged along a predetermined axis. The first region of the mount member has a ferrule support extending along the predetermined axis and supporting the ferrule, the second region has a grating chip support extending along the predetermined axis and supporting the grating chip, and the third region has a device support on which the semiconductor optical amplifier is mounted.

In the above light emitting device, the grating chip has the diffraction grating and is optically coupled to the semiconductor optical amplifier. An optical cavity is comprised of the light reflecting surface of the semiconductor optical amplifier and the diffraction grating of the grating chip. Since the grating chip and the semiconductor optical amplifier are mounted on the same mount member, the optical module is provided using no pigtail fiber.

In the light emitting device according to the present invention, the mount member has a butt surface provided between the second region and the third region so as to intersect with the predetermined axis and the first end face of the grating chip butts against the butt surface. Since the mount member can be formed with accuracy, it is easy to determine the relative positions of the butt surface and the semiconductor optical amplifier. Once the grating chip is positioned by the butt surface, the relative positions of the grating chip and the semiconductor optical amplifier are readily and accurately settled. Therefore, the cavity length can be surely and readily set at a predetermined value.

Furthermore, in the light emitting device of the present invention, the mount member is preferably made of a ceramic material. The mount member is more preferably made of silicon. When the mount member is made of one of these materials, it is feasible to accurately form the first to third regions, ferrule support, optical fiber support, and device support which the mount member has.

It is preferable to fill at least one of a clearance between the grating chip and the semiconductor amplifier and a clearance between the semiconductor amplifier and the fiber stub component with a translucent resin. The use of the translucent resin securely implements optical coupling between the elements.

A grating chip according to one aspect of the present invention comprises a first end face, a second end face, and a diffraction grating, wherein the diffraction grating is formed so as to have a length equal to half or more of a distance between the first end face and the second end face.

A grating chip according to another aspect of the present invention comprises a first end face, a second end face, and a diffraction grating, wherein the diffraction grating is formed so as to have a length equal to three fourths or more of a distance between the first end face and the second end face. This configuration permits the grating chip to be constructed in small size. Then the light emitting device and the optical module using this grating chip are also constructed in compact.

Preferably, at least one of the first end face and the second end face of the above grating chip is inclined relative to the optical axis. This prevents reflected light from the end face of the grating chip from returning to the semiconductor optical amplifier. This enables the semiconductor optical amplifier to operate stably.

An optical module according to the present invention comprises the foregoing light emitting device, and a housing for housing the light emitting device. A first end face of the ferrule is located outside the housing. This allows the above light emitting device to be housed in the housing. In addition, an external optical fiber to be connected to the optical module is surely optically coupled to the optical module.

Another optical module according to the present invention comprises the above light emitting device, a lead frame on which the light emitting device is mounted and which has a plurality of lead terminals, and a resin body sealing the light emitting device and the lead frame so as to locate a first end face of the ferrule outside and keep the plurality of lead terminals projecting out. This permits electric signals from an external circuit to be easily and surely fed to the optical module.

A light emitting device apparatus according to the present invention comprises (1) a plurality of grating chips each having a first end face, a second end face, and a diffraction grating; (2) a plurality of semiconductor optical amplifiers each having a light emitting surface and a light reflecting surface and being optically coupled to the first end face of the respective grating chips; (3) a plurality of optical fibers each having a pair of end faces and being optically coupled to the second end face of the respective grating chips; and (4) a mount member having first, second, and third regions arranged along a predetermined axis. The first region has a plurality of optical fiber supports supporting each of the optical fibers, the second region has a plurality of grating chip supports supporting the respective grating chips, and the third region has a mount region in which the plurality of semiconductor optical amplifiers are juxtaposed.

In the above light emitting device apparatus, each of the optical fibers preferably has a first portion supported on an optical fiber support and a second portion projecting out from the first region. Furthermore, a plurality of optical fibers are preferably held by a holding member for holding the plurality of optical fibers, in the second portion.

The present invention can be further fully understood from the detailed description and accompanying drawings which will follow. It is noted that these are presented simply for an illustrative purpose but are not to be considered to limit the present invention.

BRIEF DESCRIPTION OF THE DRAWINGS

FIGS. 9A and 9B are diagrams to illustrate a step of fixing a fiber stub component and a grating chip onto a mount member.

DETAILED DESCRIPTION OF THE INVENTION

Embodiments of the present invention will be described below in detail with reference to the accompanying drawings. The same reference symbols will denote the same elements throughout the description of the drawings, without redundant description thereof.

Figure 1:
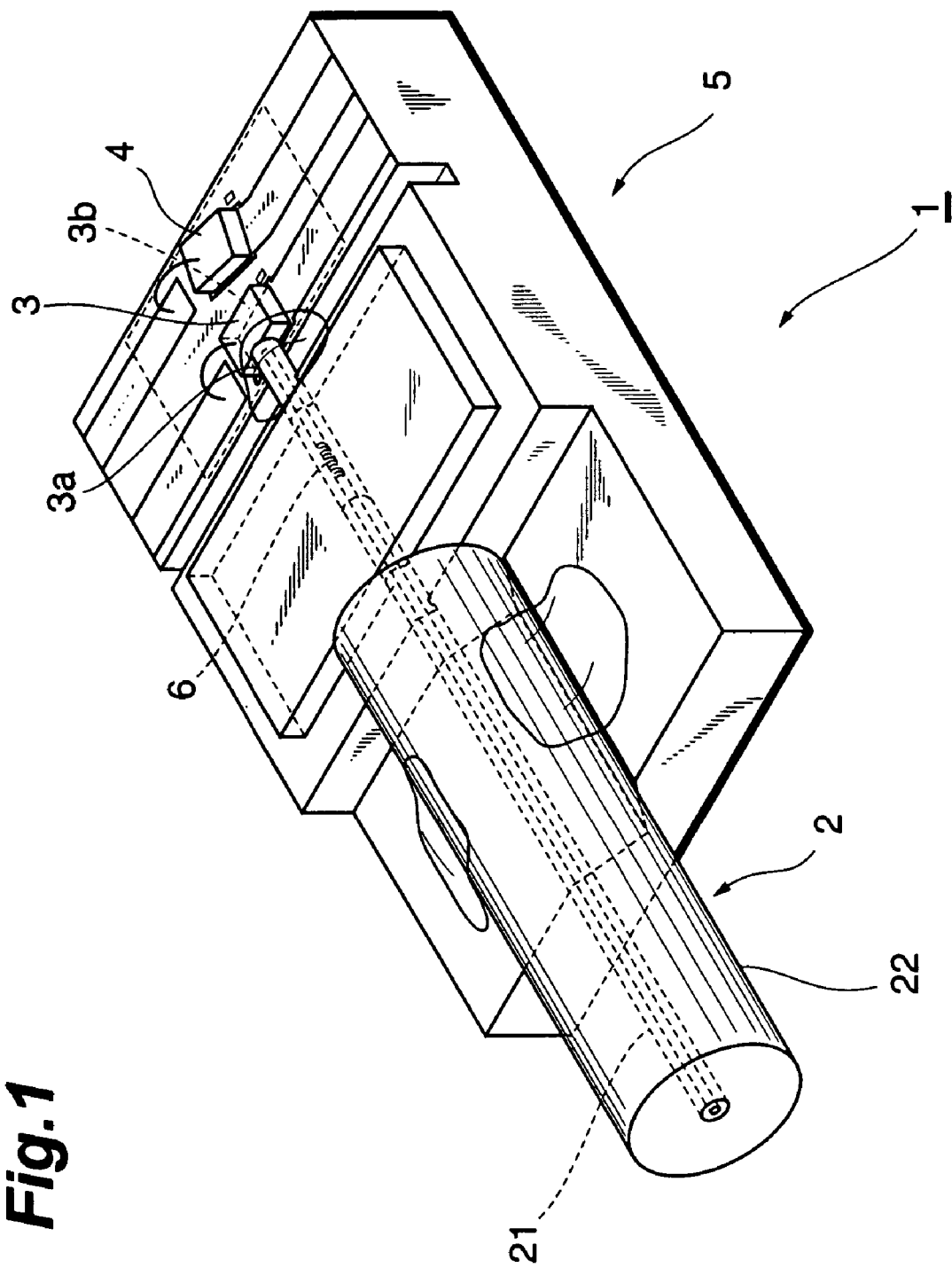
FIG. 1 is a perspective view showing a configuration of a light emitting device in the first embodiment.

FIG. 1 is a perspective view showing a configuration of a light emitting device in the first embodiment. Now referring to FIG. 1, the light emitting device 1 has the following major components: fiber stub component 2, grating chip 6, semiconductor optical amplifier 3, photodiode 4, and mount member 5. The fiber stub component 2 is optically coupled to the grating chip 6, and the grating chip 6 is optically coupled to the semiconductor optical amplifier 3. The photodiode 4 is optically coupled to the semiconductor optical amplifier 3.

First, the fiber stub component 2 will be described with reference to FIG. 2. The fiber stub component 2 has an optical fiber 21 and a ferrule 22. The optical fiber 21 is of nearly cylindrical shape. The length along the longitudinal direction of the optical fiber 21 is larger than that of the ferrule 22 and is approximately 7–20 mm, for example. The outside diameter of the optical fiber 21 is, for example, approximately 125 μm and the core diameter approximately 10 μm. The ferrule 22 is of nearly tubular shape extending along a predetermined axis and can be made, for example, of a ceramic material such as zirconia, or of a plastic material. The optical fiber 21 is inserted along the predetermined axis in the ferrule 22. The length along the predetermined axis of the ferrule 22 is, for example, approximately 6–12 mm.

Figure 2:
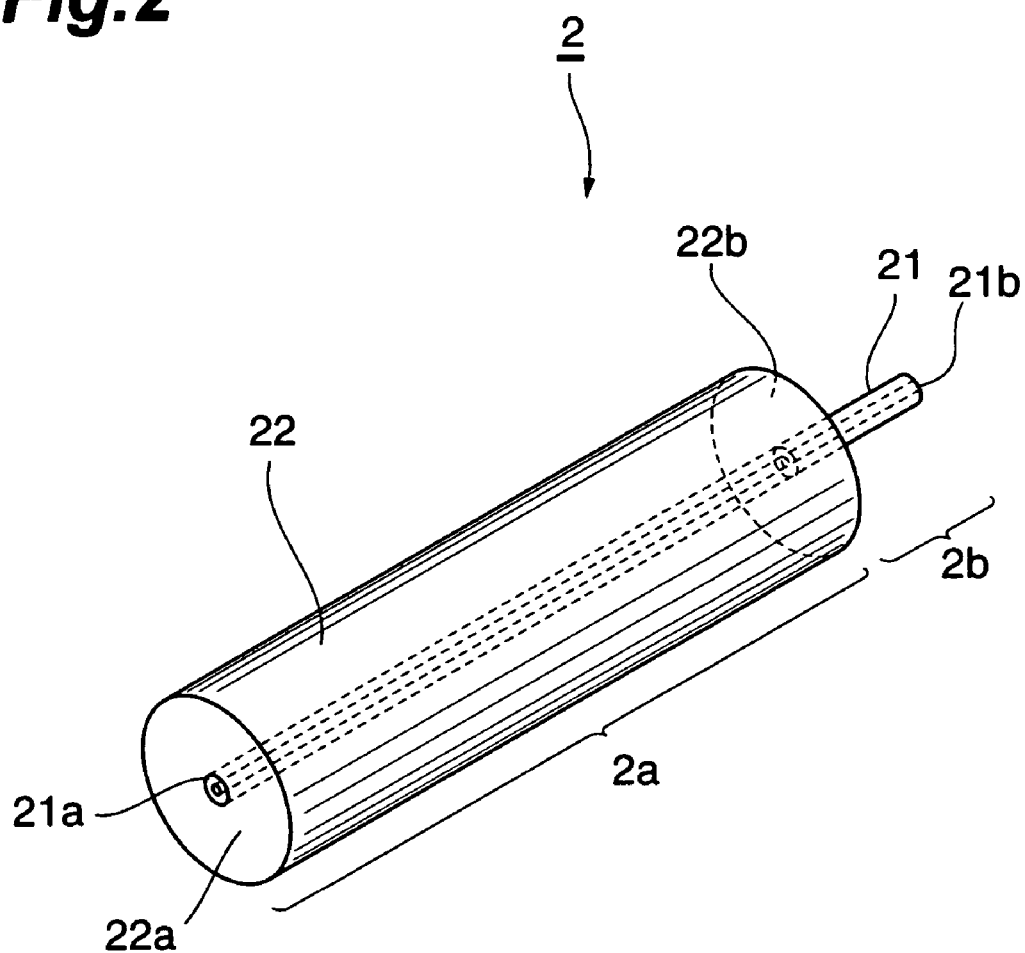
FIG. 2 is a perspective view showing a configuration of a fiber stub component.

With reference to FIG. 2, the fiber stub component 2 has a first portion 2a covering the side face of the optical fiber 21, and a second portion 2b in which the optical fiber 21 projects out from the ferrule 22. In the second portion 2b, the projecting length of the optical fiber 21 is approximately 1–8 mm. One end face 21a of the optical fiber 21 comes out in an end face 22a of the ferrule 22. For this reason, optical coupling is readily achieved between the end face 21a of the optical fiber 21 and an external optical fiber into which signal light from the light emitting device 1 is to be injected. The other end face 21b is optically coupled to the grating chip 6, as described later.

Figure 3A:
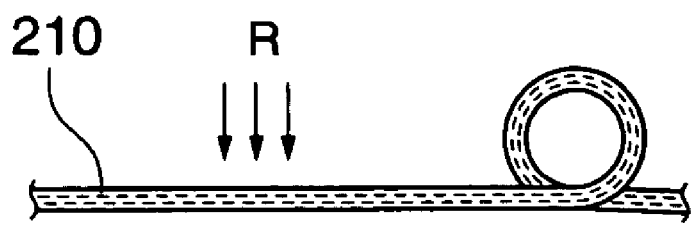
FIGS. 3A and 3B are diagrams to illustrate a procedure for preparing a grating chip.
Figure 3B:
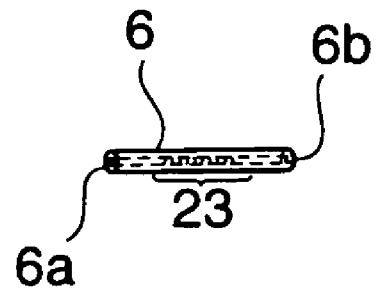

The grating chip 6 will be described next with reference to FIGS. 3A and 3B. FIGS. 3A and 3B are diagrams showing the procedure of preparing the grating chip 6. First, silica glass fiber 210 with a core region doped with $GeO_2$ is exposed to ultraviolet light R with intensity spatially periodically varying, whereby diffraction grating 23 is formed in the optical fiber (FIG. 3A). In the light emitting device 1, as described later, the diffraction grating 23 and light reflecting surface 3b of semiconductor optical amplifier 3 constitute an optical cavity. As a potential example of typical values, the pitch of diffraction grating 23 is approximately 0.53 μm and the total length of the diffraction grating 23 is not less than 1.5 mm nor more than 3.0 mm. The reflection wavelength of the diffraction grating 23 having the above pitch can be in a wavelength band, for example, such as the 1550 nm band.

After the formation of the diffraction grating 23, the optical fiber 210 is cut into a predetermined length to obtain the grating chip 6 provided with the diffraction grating 23 (FIG. 3B). The grating chip 6 is of nearly cylindrical shape with two end faces 6a, 6b. The predetermined length is approximately 2–4 mm in view of the total length of the diffraction grating 23. For example, when the total length of the diffraction grating 23 is about 2 mm, the length of the grating chip 6 is preferably not more than 4 mm so that the total length of the diffraction grating 23 becomes half or more of the length of the grating chip 6. Since this can reduce the length of the grating chip 6, the light emitting device 1 is constructed in compact size.

Figure 4A:
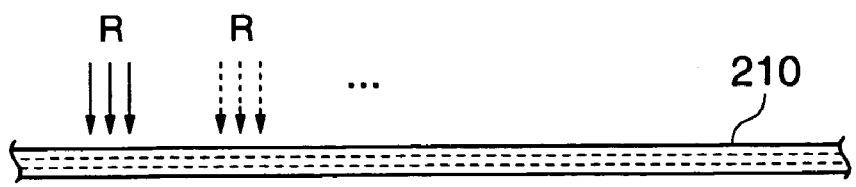
FIGS. 4A to 4D are diagrams to illustrate another procedure for preparing grating chips.
Figure 4B:
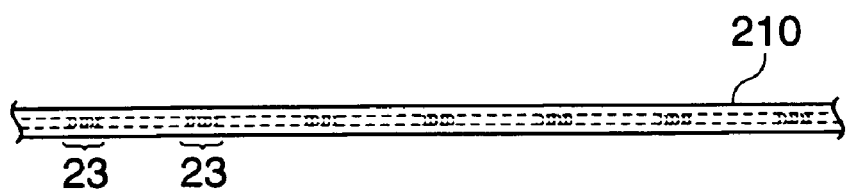

Another procedure of preparing grating chips 6 will be described with reference to FIGS. 4A–4D. Diffraction gratings can be formed at a plurality of positions in a silica glass fiber with the core region doped with $GeO_2$. Namely, as shown in FIG. 4A, the optical fiber 210 is exposed to ultraviolet light R with intensity spatially periodically varying, thereafter an ultraviolet light source or the optical fiber is moved by a predetermined distance in the longitudinal direction, and the optical fiber is again exposed to the ultraviolet light R. Repetitions of such procedure result in forming a lot of diffraction gratings 23 in a short time (FIG. 4B). In addition, use of ultraviolet beams with different spatial periods of intensity will permit diffraction gratings of different reflection wavelengths to be formed. Furthermore, in the formation of diffraction gratings 23, plural types of diffraction gratings of different reflection wavelengths may be formed in one optical fiber.

Figure 4C:
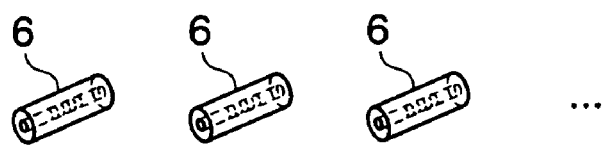
Figure 4D:
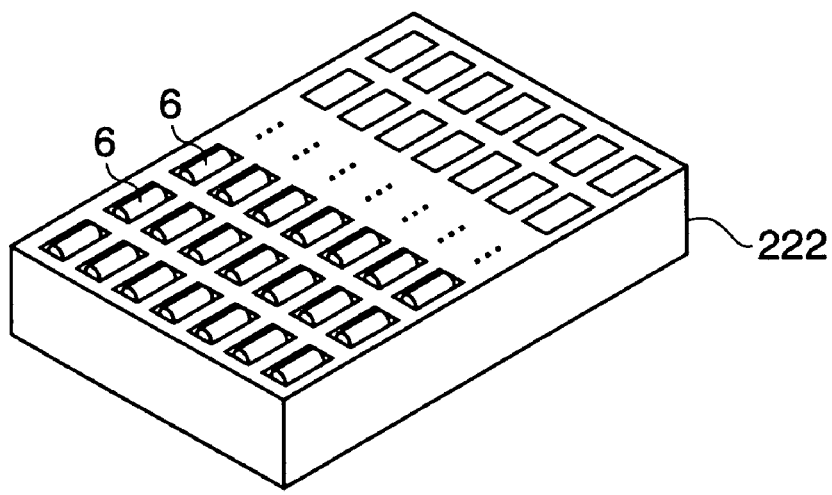

After the diffraction gratings are formed in this way, the optical fiber 210 is cut into the length of 2–4 mm, thereby obtaining a lot of grating chips 6, as shown in FIG. 4C. Here the grating chips 6 can be kept on a chip tray 222. At this time, the grating chips 6 can be kept on the chip tray 222 while being classified based on the reflection wavelengths of the diffraction gratings 23. In this arrangement, a desired grating chip 6 can be readily selected on the occasion of placing the grating chip 6 on the mount member 5.

Figure 5A:
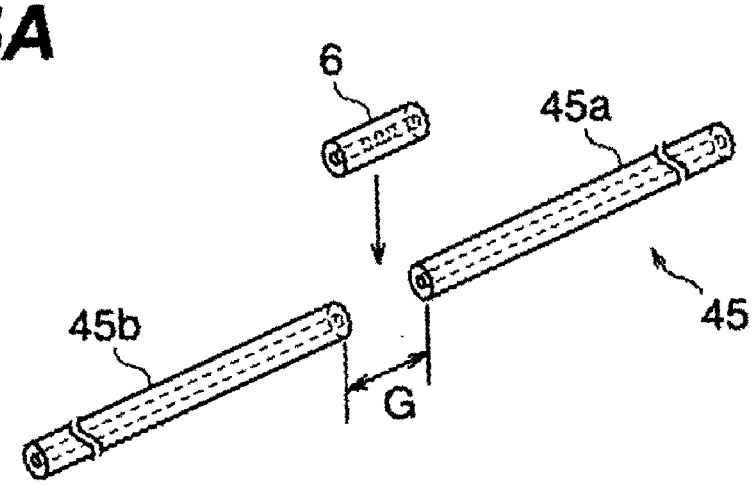
FIGS. 5A and 5B are schematic diagrams of a reflection wavelength measuring system.
Figure 5B:
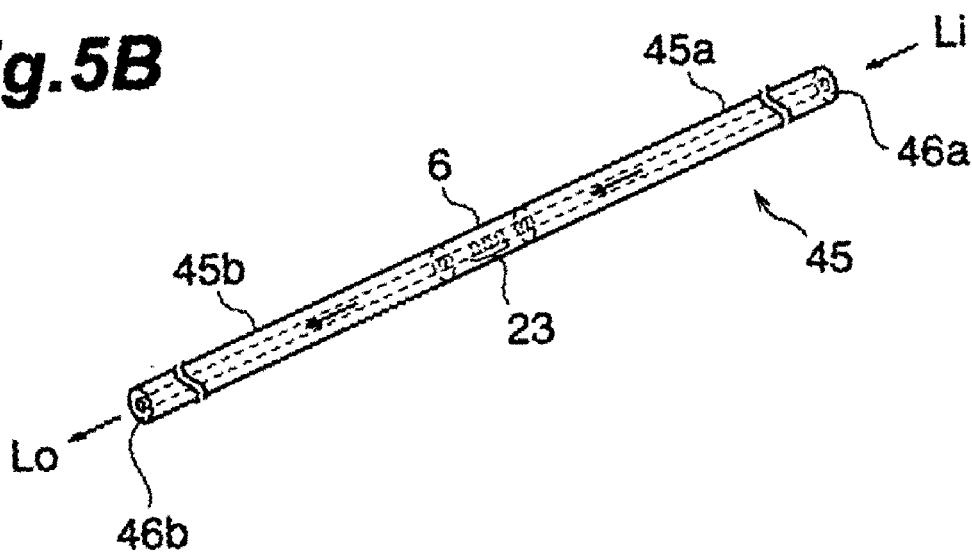

There is also some variation in reflection wavelength even among grating chips 6 classified in one group in the chip tray 222. In the case where it is necessary to more precisely determine the wavelength of light emitted from the light emitting device 1, one grating chip 6 may be further selected from a group. For this purpose, a reflection wavelength measuring system can be used. FIGS. 5A and 5B are schematic diagrams of the reflection wavelength measuring system. As shown in FIGS. 5A and 5B, the reflection wavelength measuring system 45 has optical fibers 45a, 45b. A clearance for interposition of grating chip 6 is provided between the optical fibers 45a, 45b. The optical fibers 45a, 45b are arranged so that light propagating in one core region can be injected into the other core region. The optical fibers 45a, 45b are supported by a jig (not shown). The jig for supporting the optical fibers 45a, 45b is provided with an adjusting mechanism (not shown) for adjusting the length G of the clearance.

For measuring the reflection wavelength of the grating chip 6, the grating chip 6 is fitted into the clearance, and the length G of the clearance is then adjusted to hold the grating chip 6 by the optical fibers 45a, 45b (FIG. 5B). Thereafter, light $L_i$ is injected through the end face 46a into the optical fiber 45a, then the light $L_i$ travels through the optical fiber 45a to the grating chip 6. The grating chip 6 reflects light of a reflection wavelength determined by the pitch of the diffraction grating 23 out of the light $L_i$, and this light component returns to the optical fiber 45a. The light not reflected by the diffraction grating 23 travels through the grating chip 6 into the optical fiber 45b and then emerges as light $L_o$ from the end face 46b of the optical fiber 45b. Here the optical axes can be aligned with each other while measuring the intensity of the light $L_o$. Through spectroscopy of the light $L_o$, the reflection wavelength of the diffraction grating 23 is measured.

The wavelength of the laser light emitted from the light emitting device 1 can be exactly set by selecting a grating chip 6 with a desired reflection wavelength, using the reflection wavelength measuring system as described above.

The semiconductor optical amplifier 3 will be described next. The semiconductor optical amplifier 3 has a multiple quantum well structure with active layers of InGaAsP fabricated on an InP substrate, for example, and emits light of the wavelength of about 1550 nm. Such semiconductor optical amplifier 3 can have such dimensions as the length of 300 μm, the width of 250 μm, and the height of 120 μm. The semiconductor optical amplifier 3 has a light emitting surface 3a and a light reflecting surface 3b, as shown in FIG. 1. The light emitting surface 3a is opposed to the light reflecting surface 3b. The light emitting surface 3a is comprised of an optically transparent film for maintaining the reflectance at the value not more than 0.5%, preferably, not more than 0.1%. For this reason, the reflectance is lowered on the light emitting surface 3a. The light reflecting surface 3b of the semiconductor optical amplifier 3 is comprised of a reflection film for maintaining the reflectance not less than 30% nor more than 95%, preferably, not less than 60% nor more than 90%. These optically transparent film and reflection film can be dielectric multi-layer films in which dielectrics of $SiO_2$, $TiO_2$, SiN, $Al_2O_3$, and $MgF_2$ are stacked. The foregoing optically transparent film and reflection film can be made by properly selecting materials and film thicknesses of the respective dielectric films.

The photodiode 4 can be, for example, a side-illuminated mirror photodiode having a light receiving region of InGaAsP. The photodiode 4 can have, for example, such dimensions as the length of 450 µm, the width of 450 µm, and the height of 200 µm. The photodiode 4 has its light receiving surface opposed to the light reflecting surface 3b of the semiconductor optical amplifier 3 so as to be optically coupled to the semiconductor optical amplifier 3. For this reason, the photodiode 4 serves as a monitor photodiode for detecting the intensity of output light from the semiconductor optical amplifier 3. The light receiving surface of the photodiode 4 is arranged so as to be inclined at a predetermined angle to the light reflecting surface 3b of the semiconductor optical amplifier 3. This arrangement can prevent the reflected light from the photodiode 4 from returning to the semiconductor optical amplifier 3.

Figure 6:
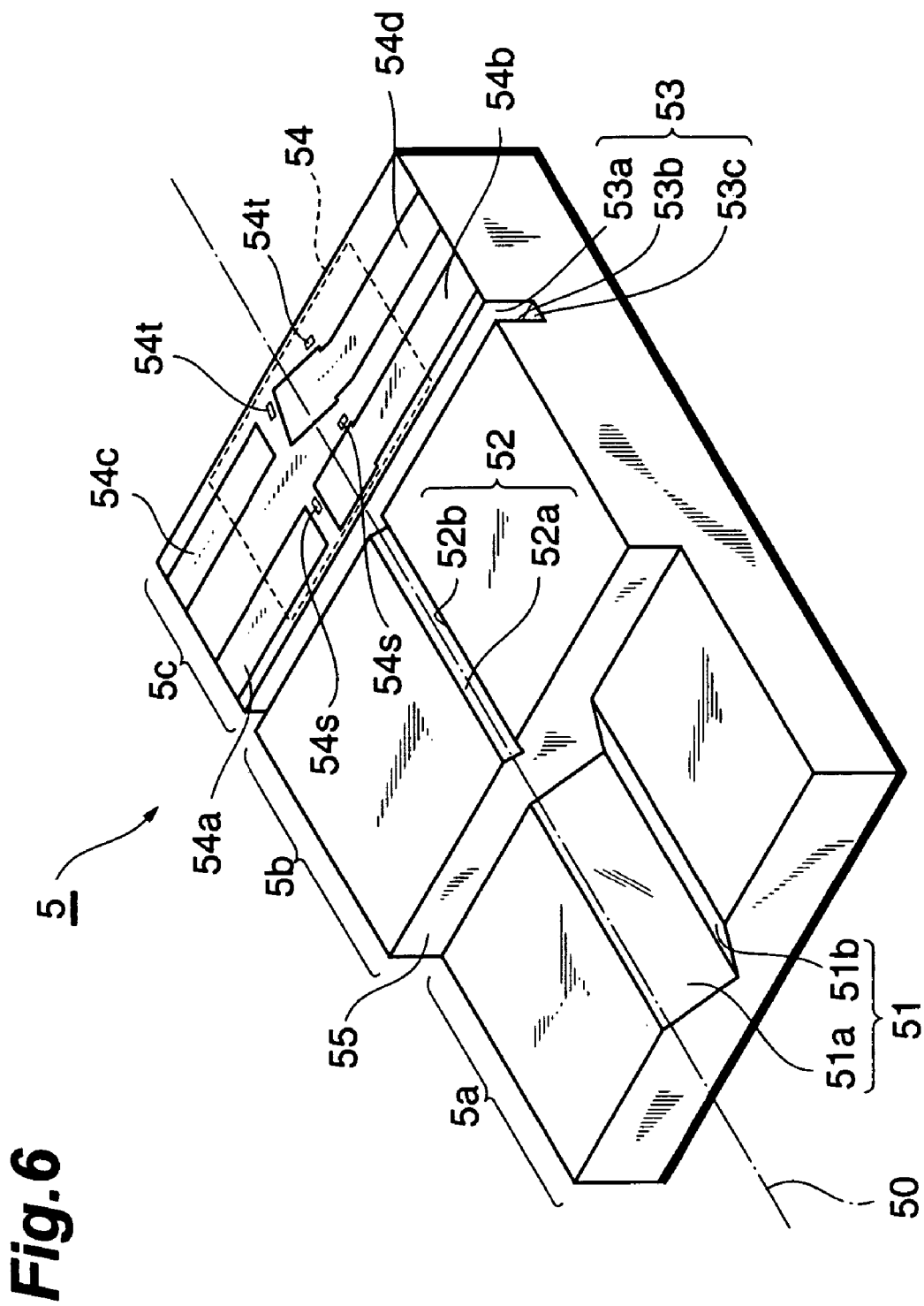
FIG. 6 is a perspective view showing a configuration of a mount member which the light emitting device has.

Subsequently, the mount member 5 will be described with reference to FIG. 6. The mount member 5 is preferably made, for example, of silicon (Si) or ceramics. The mount member 5 is a rectangular blocklike member, for example, having such dimensions as the length of about 6–10 mm, the width of about 3 mm, and the height of about 1.2 mm. The mount member 5 is provided with a first region 5a, a second region 5b, and a third region 5c along a predetermined axis 50. A level difference is made at a boundary between the first region 5a and the second region 5b, and this level difference forms a side face 55 facing the first region 5a. The side face 55 is perpendicular to the axis 50. The first region 5a is provided with a ferrule support 51 extending along the axis 50. The ferrule support 51 has two support faces 51a, 51b. These support faces 51a, 51b form a substantially V-shaped cross section in the direction perpendicular to the extending direction of the ferrule support 51. These support faces 51a, 51b support the first portion 2a of the fiber stub component 2, i.e., the side face of the ferrule 22, as shown in FIG. 1.

The second region 5b of the mount member 5 is provided with a grating chip support 52 extending along the axis 50. The grating chip support 52 has two support faces 52a, 52b. The grating chip support 52 has a substantially V-shaped cross section in the direction perpendicular to the extending direction thereof. These support faces 52a, 52b support the second portion 2b of the fiber stub component 2, and the grating chip 6, as shown in FIG. 1.

Furthermore, the mount member 5 is provided with a groove 53 for separating the second region 5b from the third region 5c of the mount member 5. The groove 53 extends so as to be perpendicular to the axis 50. The groove 53 has two side faces 53a, 53b and a bottom face 53c, and these form a rectangular cross section of the groove 53. The groove 53 is formed so as to be deeper than the grating chip support 52.

The third region 5c of the mount member 5 has a device mount region 54. The semiconductor optical amplifier 3 and photodiode 4 are mounted in the device mount region 54. The device mount region 54 has wires 54a, 54b for supplying a drive signal to the semiconductor optical amplifier 3. The device mount region 54 also has wires 54c, 54d for extracting an output signal from the photodiode 4. Furthermore, the device mount region 54 has positioning marks 54s for determining the mount position of the semiconductor optical amplifier 3 and positioning marks 54t for determining the mount position of the photodiode 4.

The mount member 5 is particularly preferably made of a silicon substrate with the principal plane of (100). The use of such a silicon substrate permits the aforementioned ferrule support 51, grating chip support 52, and groove 53 to be readily and accurately formed by forming a mask pattern by photolithography and effecting etching of the substrate. It is preferable to use an etchant with anisotropic etching rates, for example, like a KOH solution. By using such an etchant and aligning the direction of the aforementioned axis 50 with a predetermined crystal orientation, the support faces 51a, 51b and 52a, 52b can be formed of the (111) plane on which rates of etching with the KOH solution are low, or a crystal plane equivalent to the (111) plane. Namely, the grooves of the V-shaped cross section can be formed for the ferrule support 51 and the grating chip support 52. Here the ferrule support 51 and the grating chip support 52 having their respective widths different from each other can be formed, as shown in FIG. 6, by properly adjusting the etching times and the aperture widths of the mask pattern. The groove 53 can be made by forming a groove of a rectangular cross section along the [100] direction by dicing. In the case where the mount member 5 is made of a silicon substrate with the principal plane of (100), there is no need for provision of the level difference at the boundary between the first region 5a and the second region 5b. Without this level difference, a predetermined resist film is allowed to be almost uniformly applied during photolithography, which can enhance the positional accuracy of the ferrule support 51 and grating chip support 52 more. Without provision of the level difference, the ferrule support 51 needs to be deeper than in the case of provision of the level difference. When the ferrule support 51 is formed in the deeper depth, the cross section of the ferrule support 51 can be of nearly trapezoidal shape.

The predetermined positioning marks 54s, 54t for the semiconductor optical amplifier 3 and for the photodiode 4 can also be formed simultaneously with the ferrule support 51, grating chip support 52, and groove 53. For this reason, it is feasible to enhance the accuracy of the relative positions among these supports 51, 52 and groove 53, and the positioning marks 54s, 54t. The wires 54a–54d can be formed by predetermined photolithography and a metal film deposition method such as vapor deposition or sputtering.

Figure 7A:
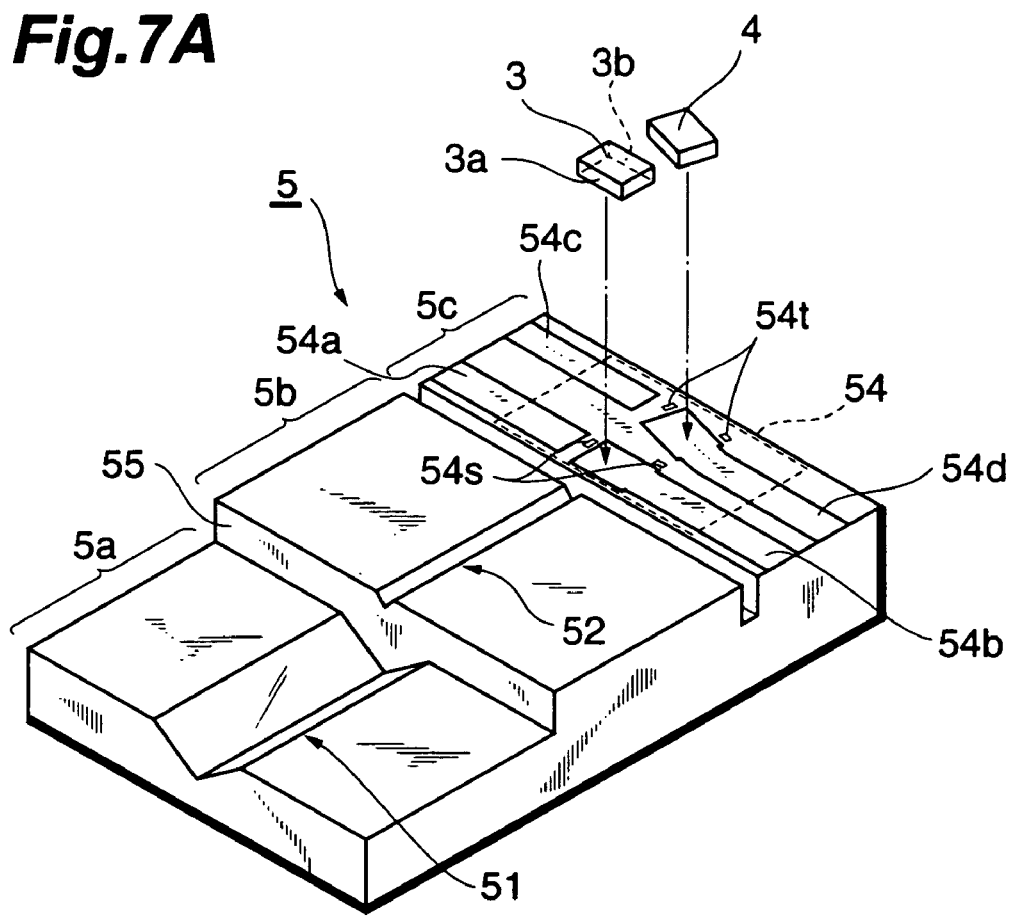
FIGS. 7A and 7B are diagrams to illustrate a step of fixing a semiconductor optical amplifier and a photodiode (PD) onto a mount member.
Figure 7B:
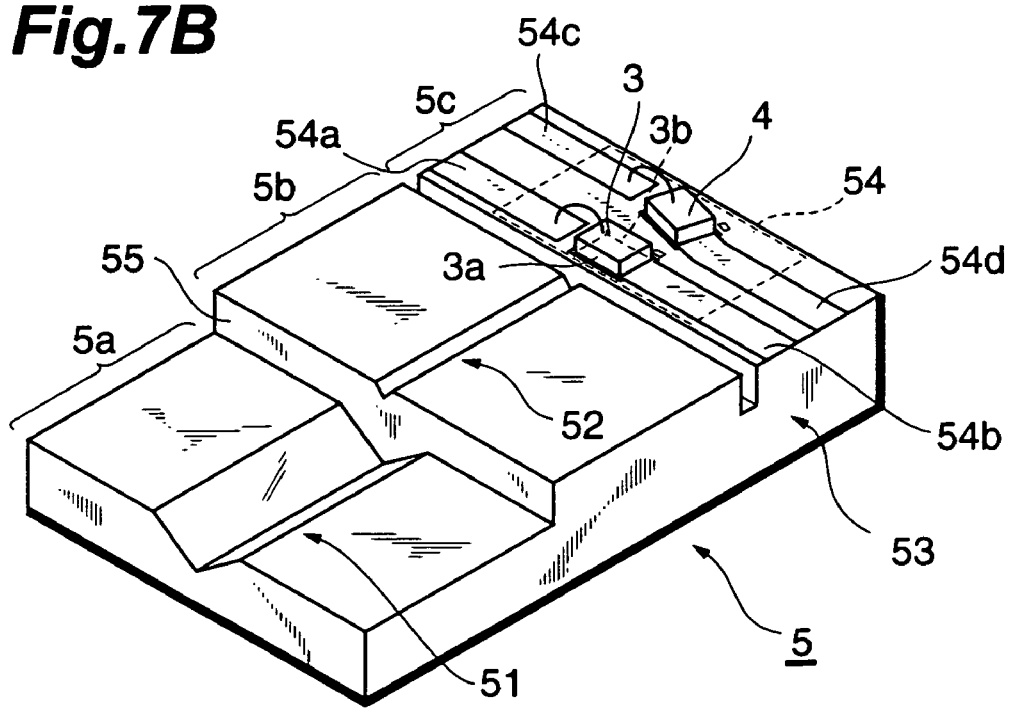

FIGS. 7A and 7B are diagrams to illustrate the step of fixing the semiconductor optical amplifier 3 and the photodiode 4 onto the mount member 5. The semiconductor optical amplifier 3 is positioned by image recognition utilizing the positioning marks 54s and is bonded onto the device mount region 54 by automated bonding (FIG. 7A). The automated bonding with a solder such as AuSn or SnPb results in electrically connecting a back electrode of the semiconductor optical amplifier 3 to the wire 54b. Thereafter, a front electrode of the semiconductor optical amplifier 3 is connected to the wire 54a by a bonding wire such as a gold wire (FIG. 7B). This completes the mounting of the semiconductor optical amplifier 3 onto the device mount region 54. The photodiode 4 is also subjected to much the same step simultaneously with the semiconductor optical amplifier 3, whereby the photodiode 4 is mounted onto the device mount region 54 (FIG. 7B).

Figure 8A:
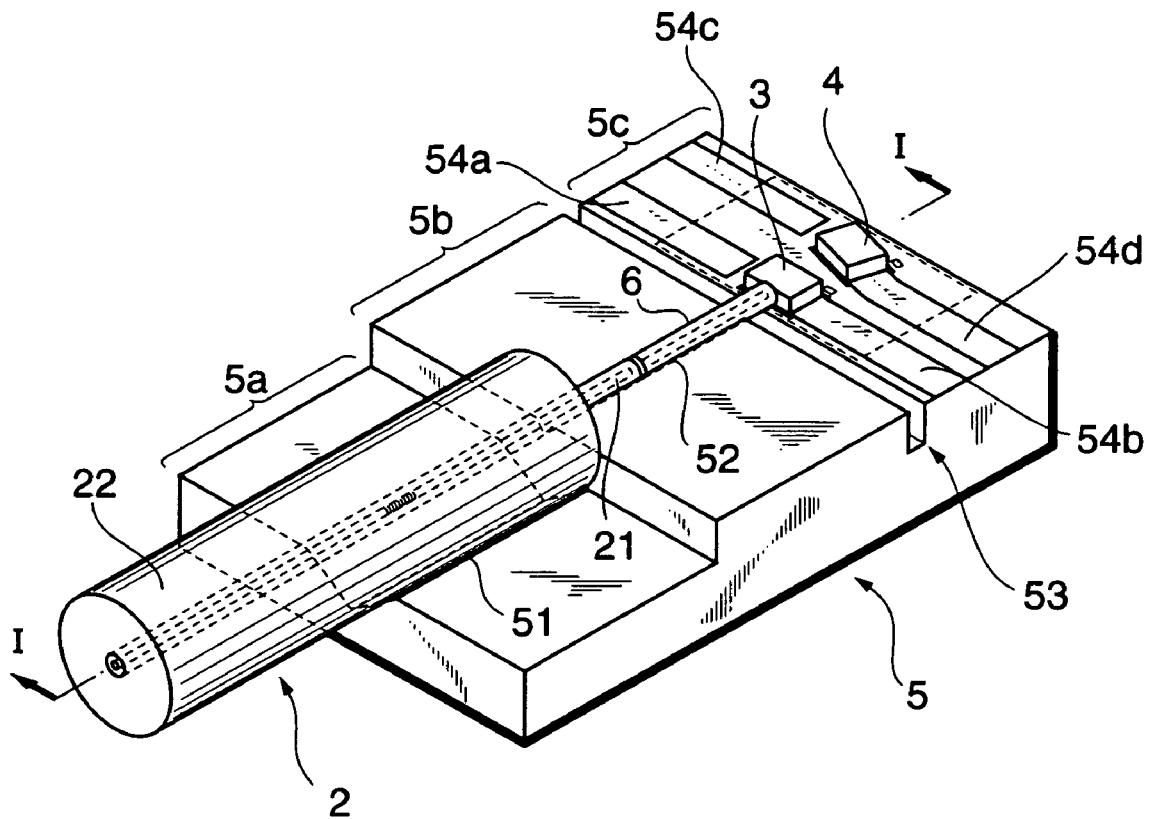
FIG. 8A is a diagram to illustrate a step of fixing a fiber stub component and a grating chip onto a mount member.

FIGS. 8A, 8B and FIGS. 9A, 9B are diagrams to illustrate the step of fixing the fiber stub component 2 and the grating chip 6 to the mount member 5. As shown in FIG. 8A, the fiber stub component 2 is first laid on the mount member 5 so that the ferrule 22 is supported on the ferrule support 51. At this time, the optical fiber 21 projecting out from the ferrule 22 is supported on the grating chip support 52. Then the grating chip 6 is mounted onto the mount member 5 so as to be supported on the grating chip support 52. The grating chip 6 is preferably selected from the chip tray 222 shown in FIG. 4D. A grating chip 6 with a desired reflection wavelength may also be selected by use of the reflection wavelength measuring system 45 shown in FIGS. 5A and 5B.

Figure 8B:
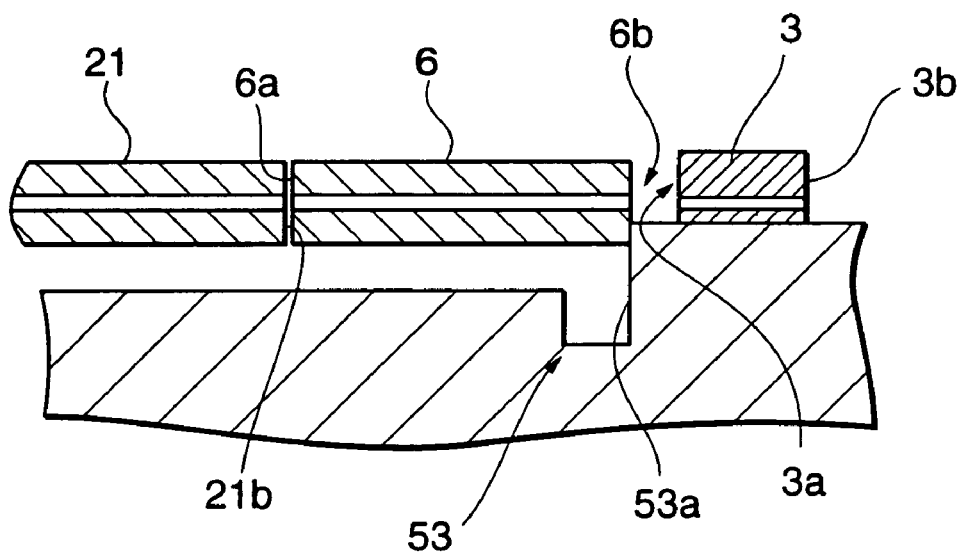
FIG. 8B is a view showing the major part of a cross section along line I—I in FIG. 8A.

FIG. 8B is a view showing the major part of the cross section along line I—I in FIG. 8A. The grating chip 6 is supported while the end face 6b thereof is in contact with the side face 53a of the groove 53. This determines the distance between the diffraction grating 23 of the grating chip 6 and the light reflecting surface 3b of the semiconductor optical amplifier 3, i.e., the cavity length. The distance between the end face 6b of the grating chip 6 and the semiconductor optical amplifier is, for example, approximately 20–70 μm. The other end face 6a of the grating chip 6 is in contact with the end face 21b of the optical fiber 21 projecting out from the ferrule 22 of the fiber stub component 2. This implements the optical coupling between the grating chip 6 and the optical fiber 21.

Reference is made here to FIG. 9A showing the step of fixing the grating chip 6 and the fiber stub component 2. First, an ultraviolet curing resin 56 as an adhesive is dropped onto the second region of the mount member 5 so as to avoid the grating chip support 52. Then a fixing member 25 is laid onto the mount member 5 so as to cover the grating chip 6 and the optical fiber 21 (second portion 2b) projecting out from the ferrule 22 from above. Thereafter, the ultraviolet curing resin 56 is hardened by irradiation with ultraviolet light to fix the fixing member 25 to the mount member 5. This results in fixing the optical fiber 21 (second portion 2b) and the grating chip 6 onto the mount member 5. The fixing member 25 is made of a material that transmits the ultraviolet light, for example, silica glass. The fixing member 25 is preferably provided with a groove 25a which receives the grating chip 6. This allows the grating chip 6 to be securely fixed.

Subsequently, as shown in FIG. 9B, an ultraviolet curing resin 57 is applied onto the ferrule 22 of the fiber stub component 2 and onto the first region of the mount member 5. Thereafter, the ultraviolet curing resin is exposed to ultraviolet light whereby the resin is hardened. This results in fixing the ferrule 22 of the fiber stub component 2 onto the mount member 5. Furthermore, for example, a silicone-based optically transparent resin 58 as a protective material is dropped and cured by potting between the end face 6b of the grating chip 6 and the semiconductor optical amplifier 3. This optically transparent resin 58 needs to have such a refractive index as not to prevent the light traveling back and forth between the semiconductor optical amplifier 3 and the grating chip 6 from entering them. The above steps complete the light emitting device 1 of the first embodiment.

When the length of the projecting portion of the optical fiber 21 from the ferrule 22 is, for example, as short as 0.5 mm, only the grating chip 6 can be fixed by the fixing member 25. In this case, it is preferable to first fix the ferrule 22 to the mount member 5 with the ultraviolet curing resin 57 and thereafter also drop and cure the optically transparent resin in the contact region between the end face 6a of the grating chip 6 and the end face 21b of the optical fiber 21 by potting. This optically transparent resin needs to have such a refractive index as not to hinder the optical coupling between the grating chip 6 and the optical fiber 21 and can be, for example, a silicone-based resin.

The light emitting device 1 operates as follows. In the light emitting device 1, an electric current containing a predetermined signal is allowed to flow through the wires 54a, 54b to the semiconductor optical amplifier 3, whereupon light is emitted from the light emitting surface 3a thereof. This light travels through the end face of the grating chip into the grating chip 6. Thereafter, lasing takes place between the diffraction grating 23 provided in the grating chip 6, and the light reflecting surface 3b of the semiconductor optical amplifier 3. Laser light generated by the lasing travels through the grating chip 6 to be emitted through the end face 21a to the outside. When an external optical fiber is placed so as to be optically coupled to the fiber stub component 2, the laser light is guided into this optical fiber.

As described above, the light emitting device 1 is constructed using the fiber stub component 2 and the grating chip 6, and the optical cavity is constructed of the diffraction grating 23 provided in the grating chip 6, and the light reflecting surface 3b of the semiconductor optical amplifier 3. The grating chip 6 is smaller than the pigtail fiber, and the second portion 2b of the fiber stub component 2 (the exposed part of the optical fiber 21) is placed on the mount member 5. Therefore, the light emitting device 1 is constructed readily in smaller size than the light emitting devices with the pigtail fiber.

The diffraction grating 23 provided in the grating chip 6 can be fabricated readily and with high mass productivity by exposing the optical fiber to the ultraviolet light. In addition, the light emitting device with any desired lasing wavelength can be fabricated according to need by preparing and keeping a plurality of grating chips 6 with diffraction gratings 23 of different reflection wavelengths.

Since the fiber stub component 2, grating chip 6, semiconductor optical amplifier 3, and photodiode 4 are surface-mounted on one side of the mount member 5, it is feasible to adopt the works such as the image recognition and automated bonding for the mounting of these components. This simplifies the production steps.

Furthermore, the ferrule support 51, grating chip support 52, groove 53, positioning marks 54s, 54t, and wires 54a–54d are accurately formed in the mount member 5. For this reason, the fiber stub component 2, grating chip 6, semiconductor optical amplifier 3, and photodiode 4 can be mounted in a state with high relative position accuracy on the mount member 5. Namely, there is no need for performing the step of aligning of optical axes during the mounting of these components, which results in simplifying the production steps.

Furthermore, the light emitting device 1 can be formed with the clearance of about 20–70 μm between the grating chip 6 and the semiconductor optical amplifier 3, whereby they can be optically coupled without use of a condenser lens. This can reduce the cost and process necessary for the condenser lens. In the conventional case where the condenser lens was mounted using a component such as a metal cap, it was necessary to perform a step of welding the cap to a predetermined mount member after execution of the step of alignment of optical axes. However, the production of optical device 1 requires neither the optical-axis alignment step nor the welding step.

Furthermore, the light emitting device 1 has the following advantage, as compared with the conventional light emitting devices using the Fabry-Perot semiconductor laser device or the DFB semiconductor laser device. In the conventional light emitting devices, where the temperature of these semiconductor laser devices varies with change in driving states, the cavity length in the semiconductor laser devices will change, so as to change the wavelength of the light emitted from the light emitting devices. For this reason, a temperature control device was used in order to keep the temperature of the semiconductor laser device constant. In the light emitting device 1 of the first embodiment, however, the optical cavity is comprised of the diffraction grating 23 formed in the grating chip 6, and the light reflecting surface of the semiconductor optical amplifier. Therefore, the grating chip is rarely affected by the temperature change of the semiconductor optical amplifier. The change in the lasing wavelength due to the temperature change is thus reduced in the light emitting device 1.

If the end face of the grating chip 6 is arranged to be inclined relative to the optical axis of the light propagating in the grating chip 6, it becomes feasible to reduce the return of the reflected light from the end face to the semiconductor optical amplifier. Accordingly, the semiconductor optical amplifier can operate stably.

The light emitting device 1 described in the above first embodiment can be used, for example, in a state in which it is mounted on a circuit board, and it is housed in a package to be used as an optical module. The second embodiment will describe an optical module to which the light emitting device 1 of the first embodiment is applied.

Figure 10:
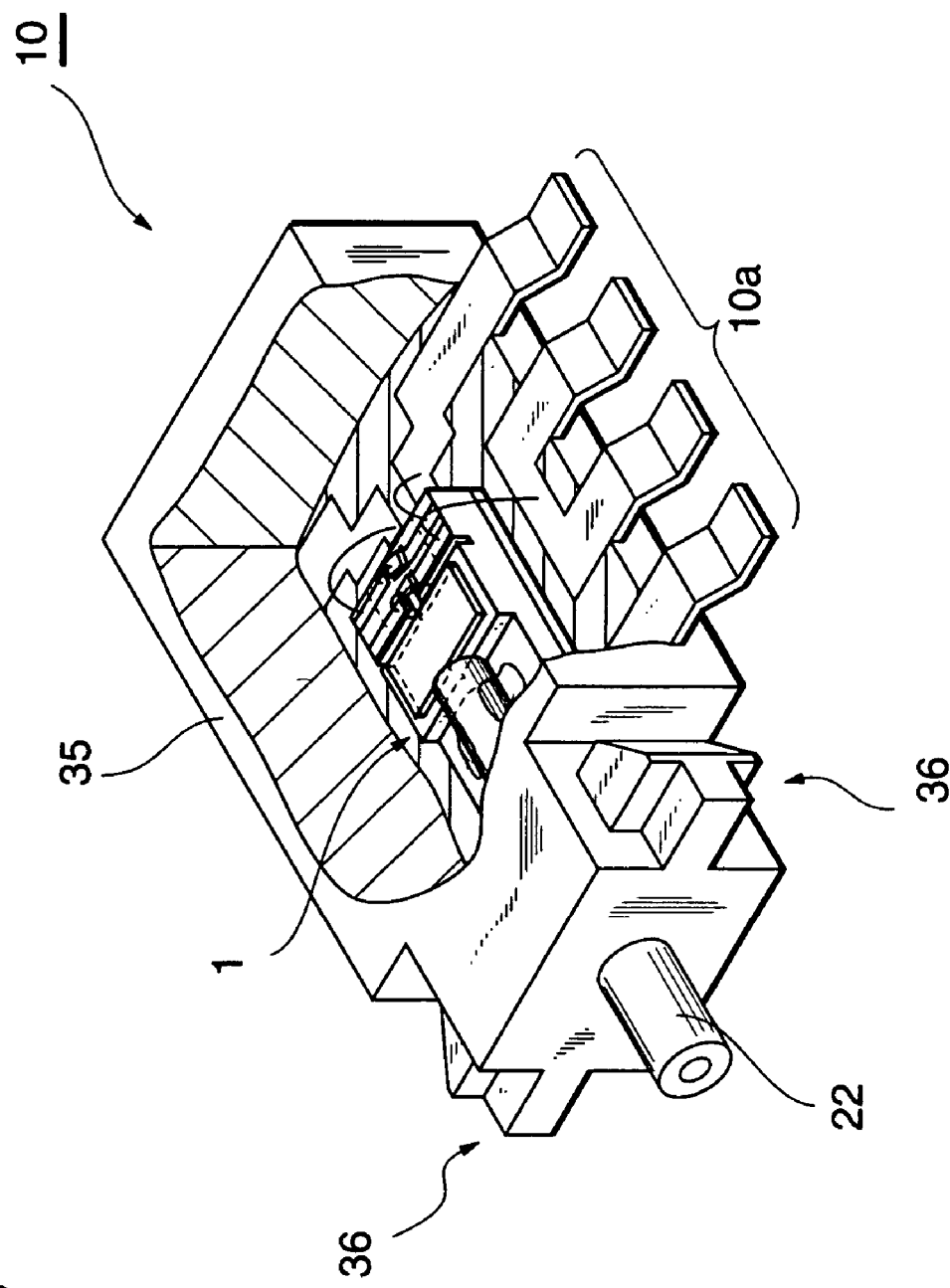
FIG. 10 is a partly broken, perspective view showing a configuration of an optical module.

FIG. 10 is a partly broken, perspective view showing a configuration of the optical module. As shown in the same figure, the optical module 10 has the light emitting device 1, a resin body 35 housing the light emitting device 1, and terminals 10a electrically connecting the optical device 1 to an external circuit. The resin body 35 has fitting portions 36. Furthermore, the ferrule 22 of the fiber stub component 2 projects out from the resin body 35. Fabrication steps of the optical module 10 will be described below.

Figure 11A:
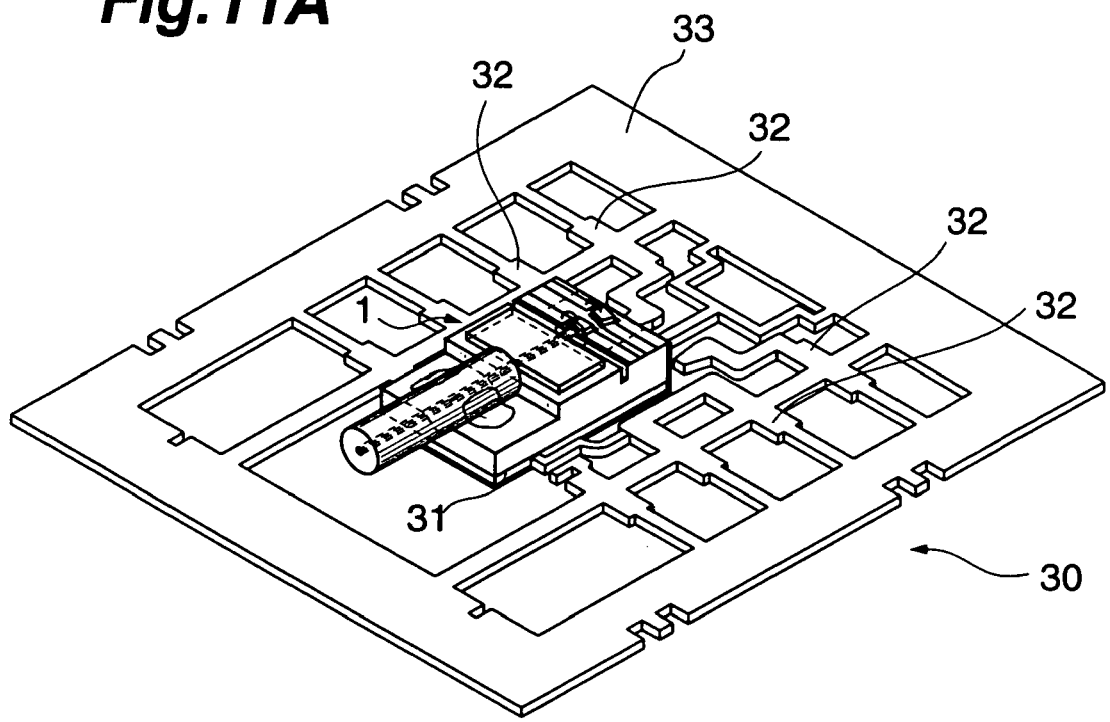
FIGS. 11A and 11B are diagrams to illustrate steps of fabricating the optical module.

FIGS. 11A, 11B and FIGS. 12A, 12B are diagrams to illustrate the steps of fabricating the optical module. As shown in FIG. 11A, the light emitting device 1 is first mounted on a lead frame component 30. The lead frame component 30 has a die pad 31 on which the light emitting device 1 is mounted, a plurality of leads 32 to become terminals of the optical module, and an outer frame 33. The light emitting device 1 is fixed to this lead frame component 30. Specifically, a silver paste is applied onto the die pad 31, the light emitting device 1 is positioned relative to the lead frame component 30, and thereafter the light emitting device 1 is mounted on the die pad 31. This results in fixing the light emitting device 1 to the lead frame component 30.

Figure 11B:
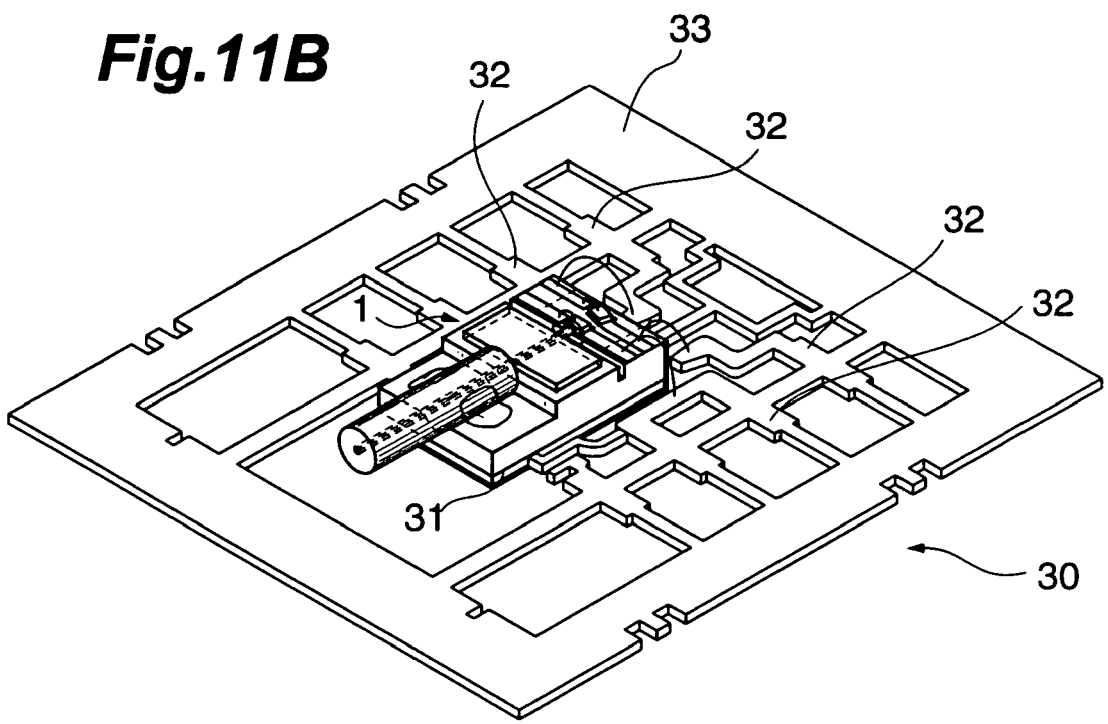
Figure 12A:
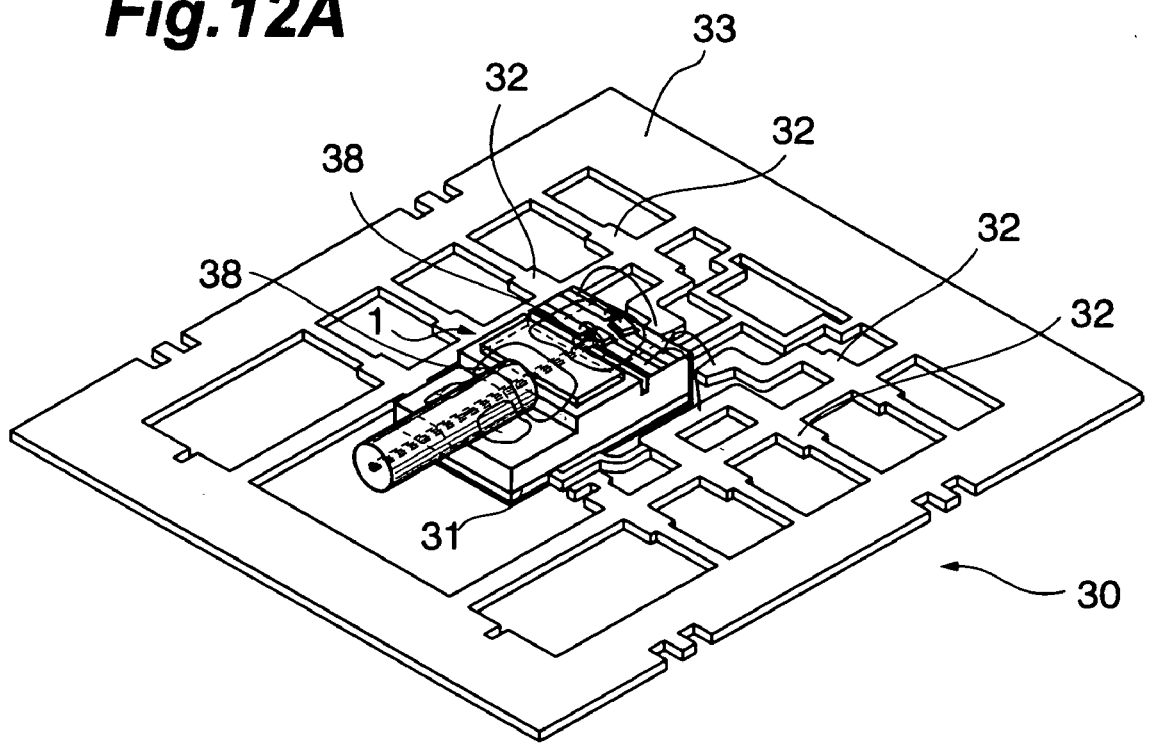
FIGS. 12A and 12B are diagrams to illustrate steps of fabricating the optical module.
Figure 12B:
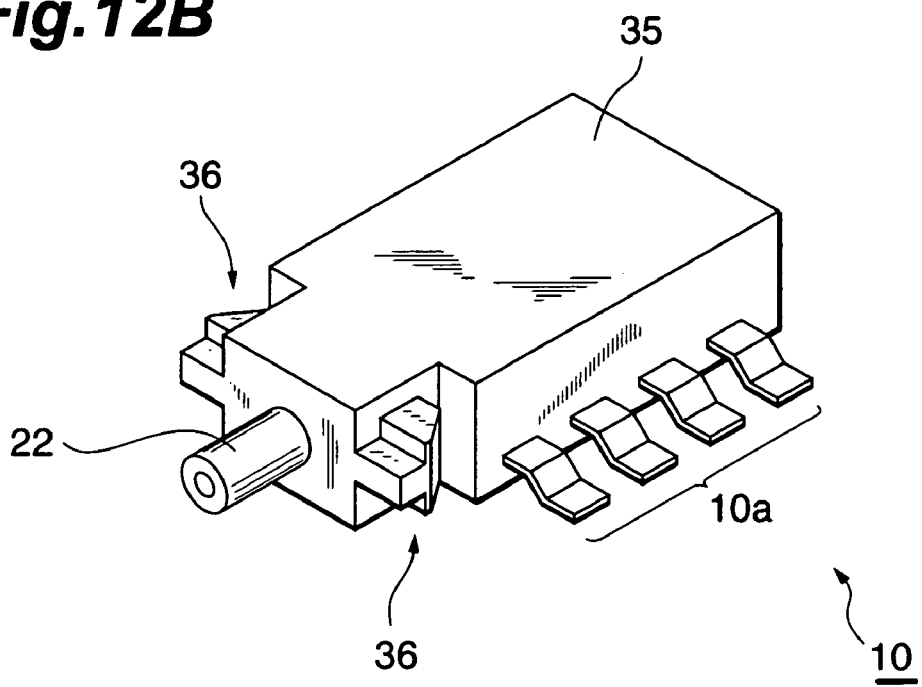

Then the leads 32 are electrically connected to the respective wires 54a–54d of the light emitting device 1 with bonding wires such as gold wires (FIG. 11B). Thereafter, a silicone-based resin 38 is applied so as to cover the grating chip 6, fiber stub component 2, fixing member 25, semiconductor optical amplifier 3, photodiode 4, and wires 54a–54d (FIG. 12A). Then the light emitting device 1 and part of the leads 32 are sealed with epoxy resin body 35 formed by transfer molding. Thereafter, the leads 32 are separated from the outer frame 33 of the lead frame component 30 to form the lead frame. This completes the so-called gull-wing optical module 10 the appearance of which is as shown in FIG. 12B. The optical module 10 can have, for example, such size as the length of about 13–15 mm, the width of about 6 mm, and the thickness of about 4 mm.

Figure 13:
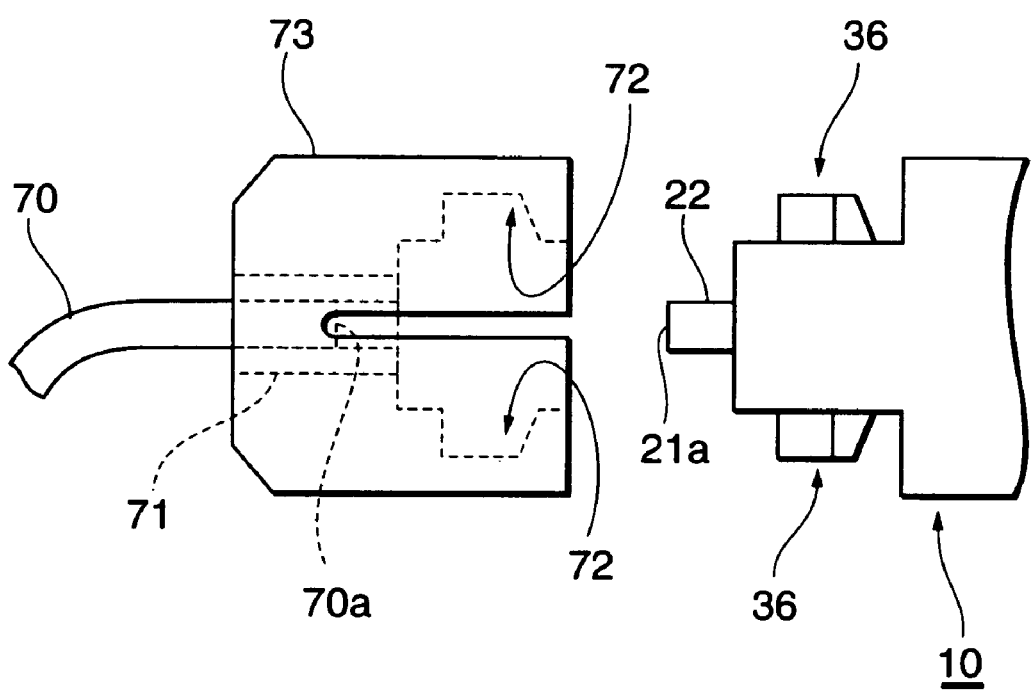
FIG. 13 is a diagram to illustrate an example of a method of connecting an optical fiber to an optical module.

The optical module 10 is connected to an external optical fiber as described below. Namely, as shown in FIG. 13, the optical module 10 is connected to optical connector 73. The optical connector 73 is provided at one end of the optical fiber 70. This connection is implemented by fitting the fitting portions 36 of the optical module 10 into fitting part 72 of the optical connector 73. This results in optically coupling the first end face 21a in the fiber stub to an end face 70a of the optical fiber 70. The optical fiber 70 is readily and surely connected to the optical module 10, as described above. In the optical module 10, the connecting means for connection to the external optical fiber is comprised of the fitting portions 36 provided in the resin body 35 and the ferrule 22 extending from the resin body 35.

The optical module 10 has the terminals 10a formed from the leads 32. For this reason, the optical module 10 can also be surface-mounted on a circuit board through the use of the terminals 10a.

Figure 14:
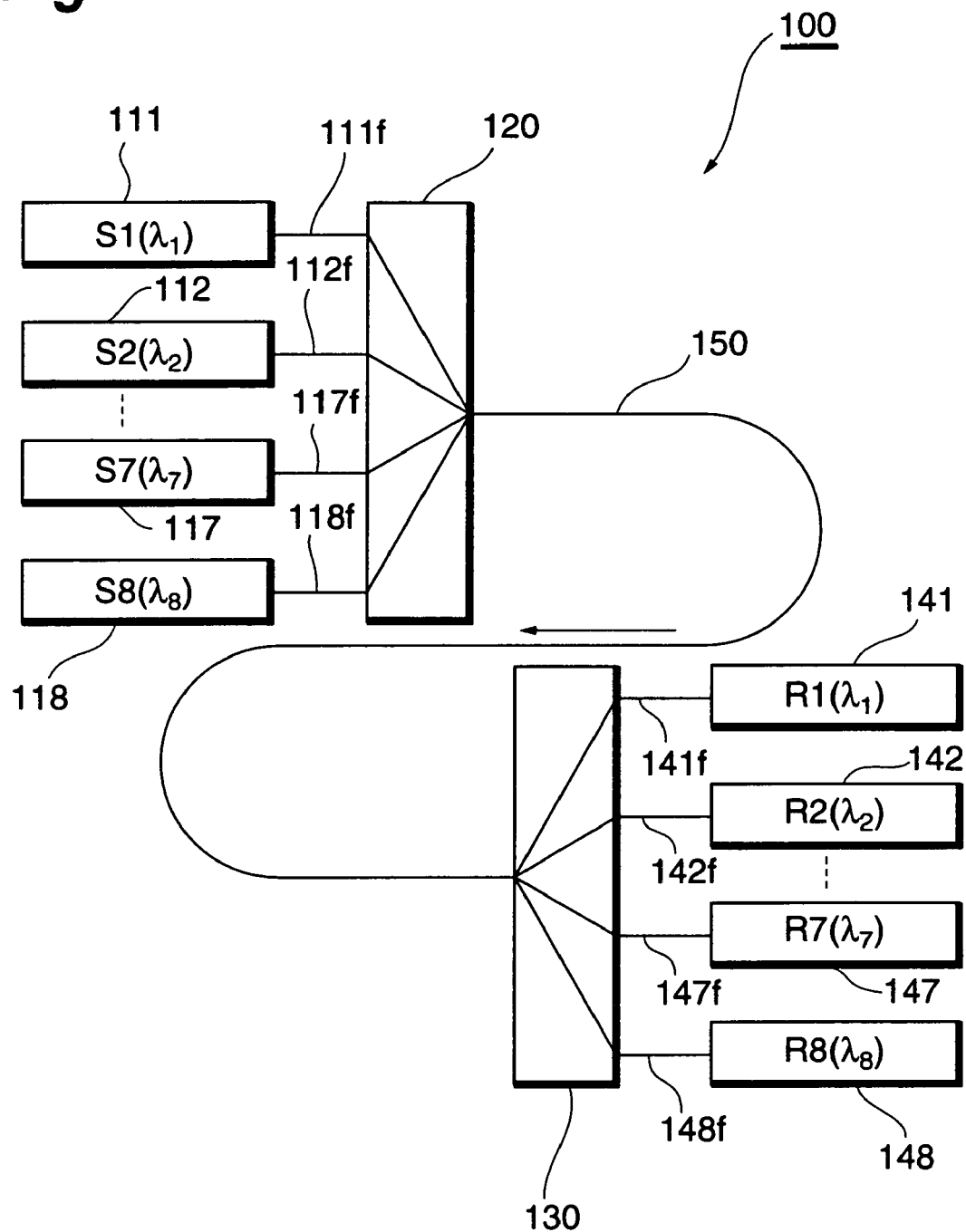
FIG. 14 is a schematic diagram showing a configuration of a multi-wavelength optical communication system.

A multi-wavelength optical communication system to which the optical module 10 is suitably applied will be described below. FIG. 14 is a schematic diagram showing a configuration of the multi-wavelength optical communication system. The multi-wavelength optical communication system 100 has optical transmitters 111–118, multiplexer 120, demultiplexer 130, and optical receivers 141–148. The multi-wavelength optical communication system 100 is further provided with optical fibers 111f–118f connecting the optical transmitters 111–118 to the multiplexer 120, an optical transmission line 150 connecting the multiplexer 120 to the demultiplexer 130, and optical fibers 141f–148f connecting the demultiplexer 130 to the optical receivers 141–148. Unrepresented output devices are connected to the respective optical transmitters 111–118 and electric signals from the respective output devices are fed to the corresponding transmitters 111–118.

The optical transmitters 111–118 are provided with their respective optical modules of different lasing wavelengths. The optical modules are constructed in the same configuration as the optical module 10, except for the difference in the wavelengths of their laser beams. Therefore, the optical modules have their respective grating chips 6 provided with diffraction gratings 23 whose reflection wavelengths are $\lambda_1$–$\lambda_8$. For this reason, the optical modules emit the laser beams of the respective wavelengths $\lambda_1$–$\lambda_8$. An example of these wavelengths is the following relation: $\lambda_1$=1536.6 nm and $\lambda_{i+1}$=$\lambda_i$+3.2 nm (i: a natural number not more than 7).

The laser beams emitted from the optical modules are not limited to the wavelengths in the 1500 nm band, but can have wavelengths in the 1300 nm band or in the 1480 nm band. Furthermore, another potential configuration is, for example, that the optical modules are a combination of four optical modules having four different wavelengths in the 1300 nm band, with four optical modules having four different wavelengths in the 1500 nm band.

The operation of the multi-wavelength optical communication system 100 will be described below. The optical transmitters 111–118 receive electric signals outputted from the respective output devices. In the optical transmitters 111–118, the optical modules convert the electric signals to optical signals. These signal beams of the wavelengths $\lambda_1$–$\lambda_8$ are injected from the optical modules into the optical fibers 111f–118f. The laser beams of the wavelengths $\lambda_1$–$\lambda_8$ travel through the optical fibers 111f–118f to the multiplexer 120 and thereafter are multiplexed into wavelength-multiplexed signal light by the multiplexer 120. The wavelength-multiplexed signal light travels through the optical transmission line 150 to the demultiplexer 130. The demultiplexer 130 demultiplexes the wavelength-multiplexed signal light into signal beams of the wavelengths $\lambda_1$–$\lambda_8$, and the signal beams thus demultiplexed travel through the respective optical fibers 141f–148f to the optical receivers 141–148. The optical receivers 141–148 convert the signal beams of the wavelengths $\lambda_1$–$\lambda_8$ to electric signals and output the electric signals to an external circuit.

In the multi-wavelength optical communication system 100 as described above, since the compact optical modules of the same configuration as the optical module 10 are used in the optical transmitters 111–118, the optical transmitters 111–118 themselves can also be constructed in compact size. The plurality of light emitting devices with the respective lasing wavelengths $\lambda_1$–$\lambda_8$ can be readily fabricated by use of fiber stubs with grating fibers of different reflection wavelengths. Accordingly, the application of the optical module 10 permits easy implementation of the multi-wavelength optical communication system and compactification of the system as well.

Figure 15:
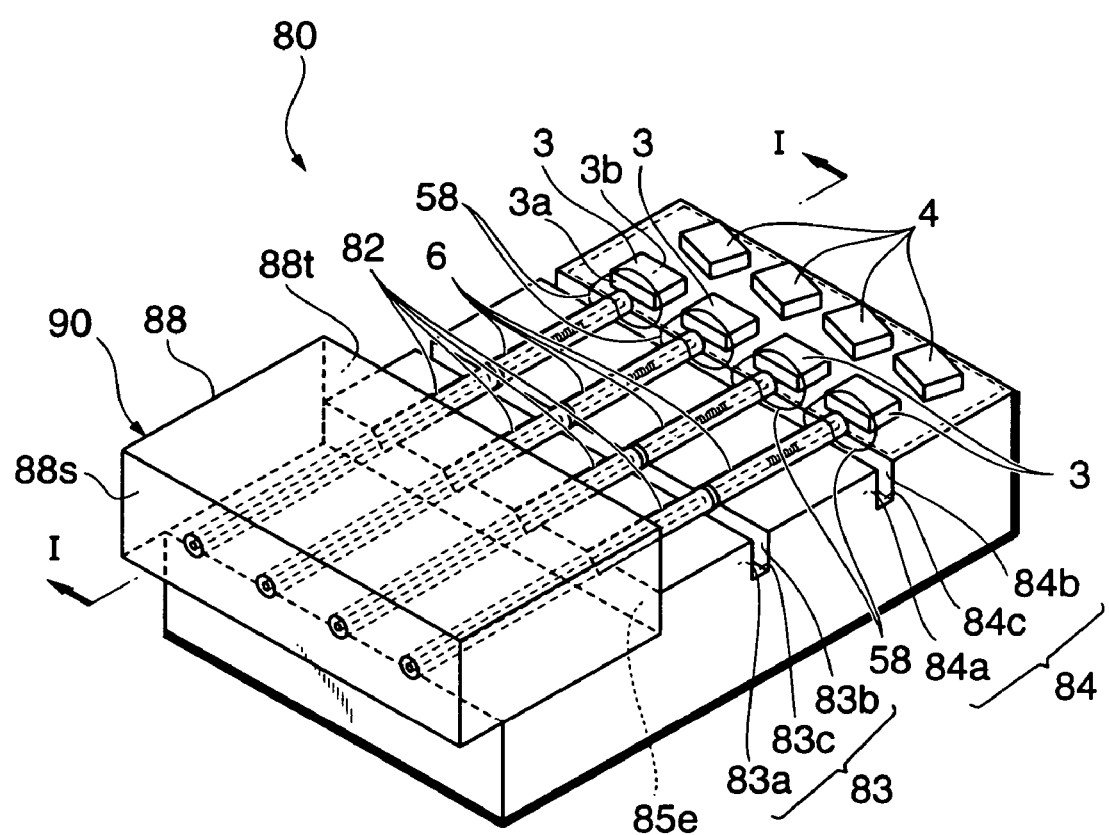
FIG. 15 is a perspective view of a light emitting device apparatus in the fourth embodiment.

A light emitting device apparatus in the fourth embodiment will be described below. FIG. 15 is a perspective view of the light emitting device apparatus in the fourth embodiment. As illustrated, the light emitting device apparatus 80 has a multi-fiber stub 90, grating chips 6, semiconductor optical amplifiers 3, photodiodes 4, and a mount member 85. The multi-fiber stub 90 is comprised of optical fibers 82 and a holding member 88. Each set of one optical fiber 82, one grating chip 6, one semiconductor optical amplifier 3, and one photodiode 4 are aligned in the order named along the direction of predetermined axis 60 (FIG. 17) and are fixed on the mount member 85. The semiconductor optical amplifiers 3 are optically coupled to the corresponding grating chips 6 and the grating chips 6 are optically coupled to the corresponding optical fibers 82. Namely, light from the light emitting surface 3a of each semiconductor optical amplifier 3 travels through the associated grating chip 6 to be outputted through the end face 82a of the corresponding optical fiber 82. The semiconductor optical amplifiers 3 are optically coupled to the corresponding photodiodes 4. Namely, light from the light reflecting surface 3b of each semiconductor optical amplifier 3 is received by the corresponding photodiode 4. The photodiodes 4 serve as monitor diodes.

The grating chips 6, semiconductor optical amplifiers 3, and photodiodes 4 are of the same structure as the devices or chip used in the light emitting device 1 in the first embodiment and play the same roles. The multi-fiber stub component 90 and the mount member 85 will be described below.

Figure 16:
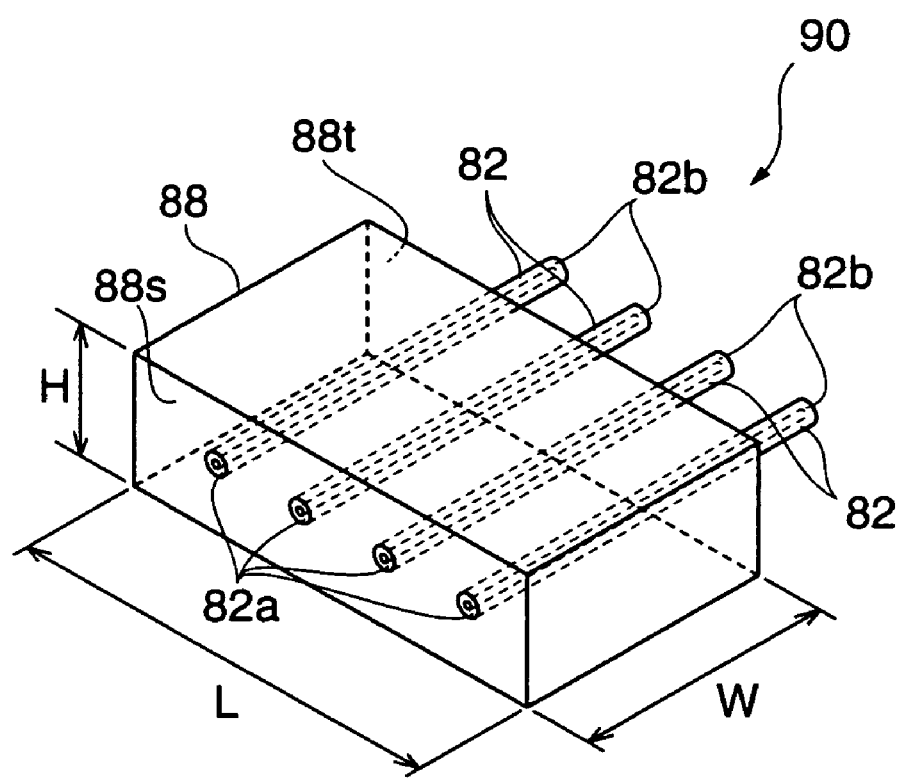
FIG. 16 is a perspective view of a multi-fiber stub having a holding member and optical fibers held by the holding member.

FIG. 16 is a perspective view of the multi-fiber stub component 90. The multi-fiber fiber stub component 90 is constructed in a configuration wherein four optical fibers 82 are held by the holding member 88. The holding member 88 is made, for example, of silica glass. The holding member 88 is a rectangular blocklike member having the length L of 8–16 mm, the width W of 6–8 mm, and the height H of 2–4 mm.

The optical fibers 82 are held by the holding member 88 according to the following procedure, for example. Namely, four through holes for insertion of optical fibers are made at predetermined intervals through an epoxy resin having the above-described size. This yields the holding member 88. Here the predetermined intervals are equal to intervals of optical fiber supports 81 provided in the mount member 85 described later. Then a thermosetting adhesive is poured into the through holes, and optical fibers to become the optical fibers 82 are inserted into the four through holes. At this time, the optical fibers are set so as to project out by an appropriate length from side face 88t of the holding member 88. In this state the holding member 88 and optical fibers are heated to harden the thermosetting adhesive.

Thereafter, the optical fibers projecting out from the holding member 88 are cut. Here the length of the optical fibers 82 projecting out from the side face 88t is approximately 6 mm. The optical fibers projecting out from the side face 88s are cut and polished so as not to project out from the side face 88s of the holding member 88. The multi-fiber stub component 90 is obtained according to the above procedure.

The mount member 85 will be described below with reference to FIG. 17. The mount member 85 has a first region 85a, a second region 85b, and a third region 85c in the order named along the direction of predetermined axis 60, as illustrated. The mount member 85 is provided with a groove 83 for separating the first region 85a from the second region 85b. The groove 83 extends so as to be perpendicular to the axis 60. The groove 83 has two side faces 83a, 83b and a bottom face 83c and these form a rectangular cross section of the groove 83. The mount member 85 is also provided with a groove 84 for separating the second region 85b from the third region 85c. The groove 84 extends so as to be perpendicular to the axis 60. The groove 84 has two side faces 84a, 84b and a bottom face 84c and these form a rectangular cross section of the groove 84.

The first region 85a is provided with four optical fiber supports 81 extending in the direction of axis 60. Intervals of these can be, for example, 250–1000 μm. Each optical fiber support 81 has two support faces 81a, 81b. The support faces 81a, 81b form a nearly V-shaped cross section in the direction perpendicular to the extending direction of the optical fiber support 81. The support faces 81a, 81b support the optical fiber 82, as seen from FIG. 15.

The second region 85b of the mount member 85 is provided with four grating chip supports 86 extending in the direction of the predetermined axis 60. Each of the four grating chip supports 86 is arranged on the same straight line as one optical fiber chip support 81 is arranged. Each grating chip support 86 has two support faces 86a, 86b. A cross section perpendicular to the extending direction of the grating chip support 86 is nearly V-shaped. These support faces 86a, 86b support the grating chip 6, as readily understood with reference to FIGS. 15 and 17.

The third region 85c of the mount member 85 has a device mount region 87. The semiconductor optical amplifiers 3 and photodiodes 4 are mounted in the device mount region 87. The device mount region 87 has wires (not shown) for supplying drive signals to the semiconductor optical amplifiers 3. The device mount region 87 also has wires (not shown) for extracting output signals from the photodiodes 4. Furthermore, the device mount region 54 has positioning marks (not shown) for determining the mount positions of the semiconductor optical amplifiers 3 and positioning marks (not shown) for determining the mount positions of the photodiodes 4.

The mount member 85 is also provided with a holding portion 85d for holding the multi-fiber stub component 90 so as to be adjacent to the first region 85a. The boundary between the holding portion 85d and the first region 85a is perpendicular to the axis 60. A level difference is provided at the boundary and this level difference forms a side face 85e. The side face 88t of the holding member 88 (FIG. 15) is brought into contact with the side face 85e whereby the holding member 88 is positioned.

The mount member 85 can be made of Si or ceramics as the mount member 5 was in the first embodiment. The mount member 85 is particularly preferably made of a silicon substrate with the principal plane of (100). The use of this Si substrate permits the mount member 85 to be readily and accurately fabricated by photolithography and etching.

Figure 17:
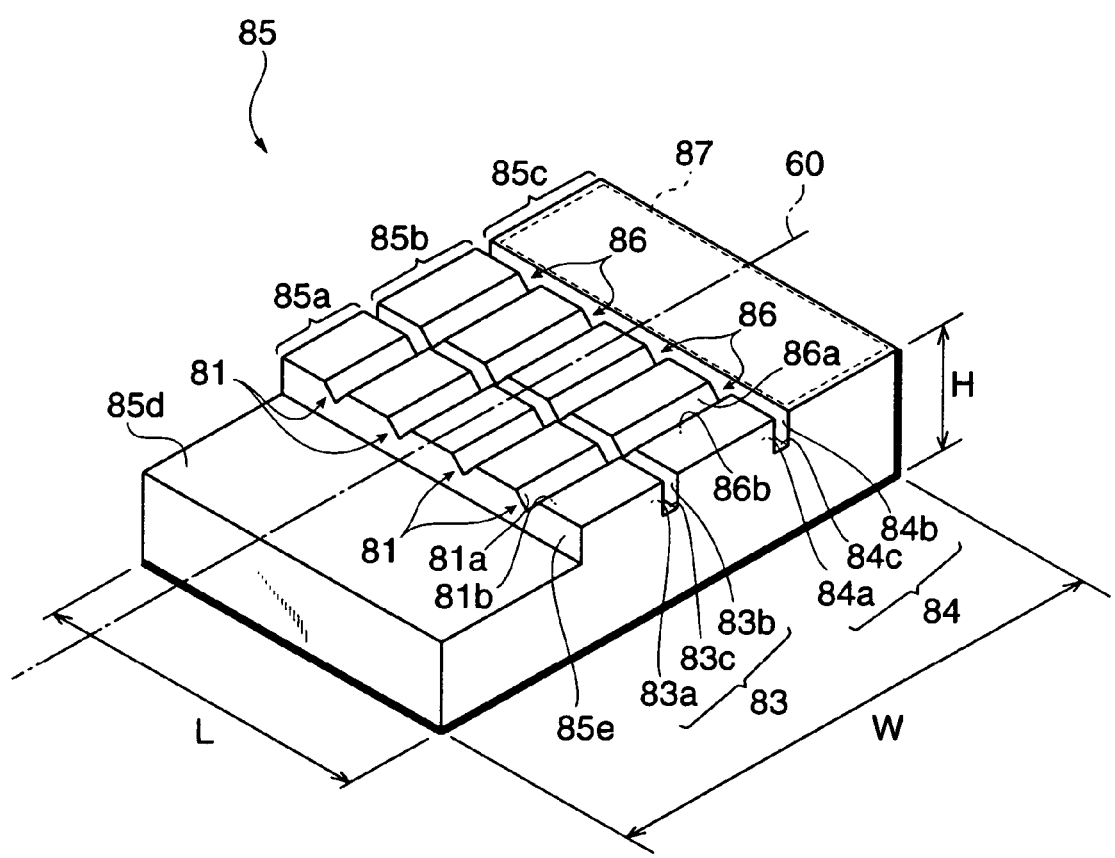
FIG. 17 is a diagram to illustrate a mount member which the light emitting device apparatus of the fourth embodiment has.

An example of the size of the mount member 85 is the length L of 3 mm, the width W of 7–12 mm, and the height H of 0.5–1.5 mm in FIG. 17. As illustrated, the mount member 85 is a rectangular blocklike member.

Subsequently, an example of a method of producing the light emitting device apparatus 80 will be described. It is assumed in the description below that the multi-fiber stub component 90 was fabricated according to the procedure as described above.

First, the semiconductor optical amplifiers 3 and photodiodes 4 are fixed. For fixing them, the image recognition and automated bonding can be used as in the case of the method of fixing the semiconductor optical amplifier 3 and photodiode 4 onto the mount member 5 in the first embodiment. Then, as in the first embodiment, the semiconductor optical amplifiers 3 are connected to the wires (not shown) on the mount member 85 with bonding wires such as gold wires and the photodiodes 4 are connected to the wires (not shown) on the mount member 85 with bonding wires such as gold wires. The above completes the fixing of the semiconductor optical amplifiers 3 and photodiodes 4.

Then the grating chips 6 are laid on the second region 85b so as to be supported on the grating chip supports 86. Furthermore, an ultraviolet curing resin is applied as an adhesive onto the holding portion 85e and thereafter the holding member 88 constituting the multi-fiber stub component 90 is laid on the holding portion 85d so that the side face 88t thereof is in contact with the side face 85e of the mount member 85.

Figure 18:
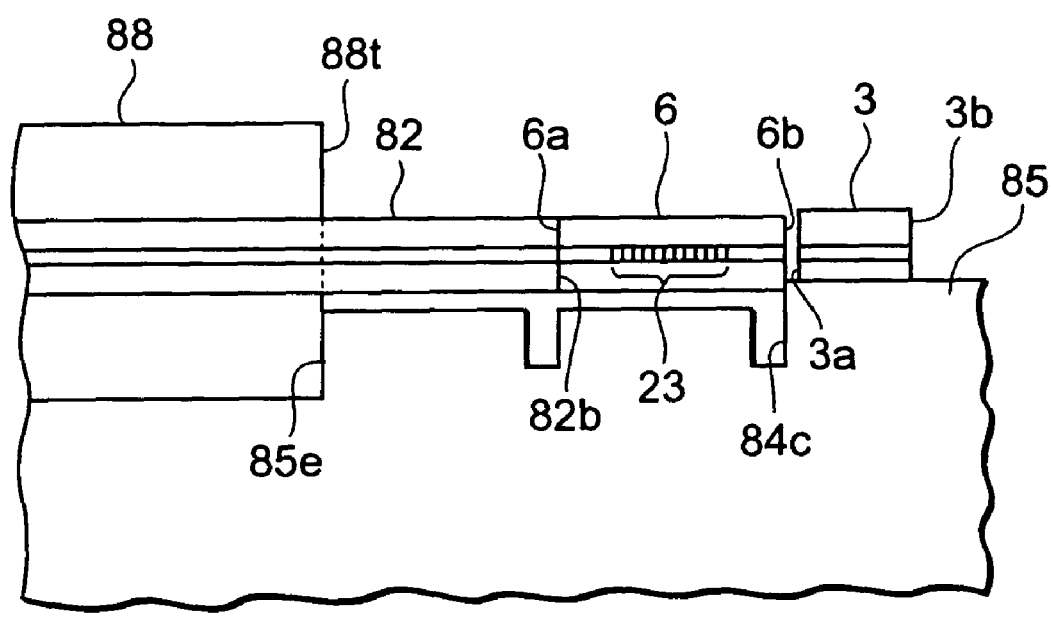
FIG. 18 is a sectional view along line I—I in FIG. 15.

FIG. 18 is a sectional view of the light emitting device apparatus 1, which shows part of the cross section along line I—I in FIG. 15. The grating chip 6 is arranged so that the end face 6b thereof is in contact with the side face 84c of the groove 84, as shown in FIG. 18. This arrangement determines the distance between the diffraction grating 23 of the grating chip 6 and the light reflecting surface 3b of the semiconductor optical amplifier 3, i.e., the cavity length. The holding member 88 is positioned so that the side face 88t thereof is in contact with the side face 85e of the mount member 85. When the holding member 88 is positioned, the end faces 82b of the optical fibers 82 projecting out from the holding member 88 come to butt against the end faces 6a of the grating chips 6 in the present embodiment. This butting results in optically coupling the grating chips 6 to the optical fibers 82. It is, however, noted that the end faces 82b of the optical fibers 82 do not always have to butt against the end faces 6a of the grating chips 6 as long as the optical fibers 82 can be optically coupled to the grating chips 6.

After the grating chips 6 and the multi-fiber stub component 90 are placed on the mount member 85 as described above, these are fixed with ultraviolet curing resin 56. Specifically, the ultraviolet curing resin is dropped so as to cover the grating chips 6, and a predetermined fixing member like the fixing member 25 used in the optical device 1 of the first embodiment can be laid on the grating chips 6. Thereafter, the ultraviolet curing resin is hardened by irradiation with ultraviolet light, whereby the fixing member is fixed to the mount member 85. Since the holding member 88 is made of silica glass, the ultraviolet light is also radiated into the ultraviolet curing resin applied onto the holding portion 85d. For this reason, the ultraviolet curing resin is cured, whereby the holding member 88 is fixed to the holding portion 85d.

Subsequently, for example, the silicone-based optically transparent resin 58 (FIG. 15) is dropped and cured by potting as a protecting material into between the optical fibers 82 and the grating chips 6 and between the grating chips 6 and the semiconductor optical amplifiers 3. The above completes the light emitting device apparatus 80.

The light emitting device apparatus 80 is constructed in the configuration wherein four sets of optical fibers 82, grating chips 6, semiconductor optical amplifiers 3, and photodiodes 4 are mounted on the mount member 85, as described above. In each set one optical fiber 82, one grating chip 6, one semiconductor optical amplifier 3, and one photodiode 4 are arranged in the order named in the direction of the predetermined axis 60. The length of the grating chips 6 is 2–4 mm, as described in the first embodiment, and thus the light emitting device apparatus 80 is constructed in compact size.

When the light emitting device apparatus 80 is constructed using four grating chips 6 with the diffraction gratings 23 having the respective reflection wavelengths $\lambda_1$, $\lambda_2$, $\lambda_3$, and $\lambda_4$ and using the semiconductor optical amplifiers 3 with the lasing wavelength band including the wavelengths $\lambda_1$–$\lambda_4$, it can emit four laser beams of the wavelengths $\lambda_1$, $\lambda_2$, $\lambda_3$, and $\lambda_4$. Namely, the light emitting device apparatus 80 configured to emit four laser beams of different wavelengths can be constructed by properly selecting the grating chips 6.

The production method of the light emitting device apparatus 80 described above can be modified in part so that only the semiconductor optical amplifiers 3, photodiodes 4, and the optical fibers 82 held by the holding member 88 are fixed on the mount member 85. By preparing a partly finished product of the light emitting device apparatus 80 as described, it becomes feasible to fabricate the light emitting device apparatus 80 for emitting four laser beams of any desired lasing wavelengths according to need. For implementing it, for example, grating chips 6 stored in the chip tray 222 described in the first embodiment are selected according to need and they are fixed on the grating chip supports 86 of the mount member 85.

The light emitting device apparatus 80 can be suitably applied particularly to systems similar to the multi-wavelength optical communication system 100 described in the third embodiment. The multi-wavelength optical communication system 100 used eight optical modules of the same configuration as the optical module 10, as optical transmitters 111–118. However, when light emitting device apparatus of the same configuration as the light emitting device apparatus 80 are applied instead of the optical modules, only two optical transmitters suffice. Accordingly, the system becomes more compactified, as compared with the case using eight optical modules.

The above described the light emitting device and optical module according to the present invention with some embodiments, but it is noted that the present invention is by no means intended to be limited to these embodiments and can be modified in various ways.

The mount member 5 of the above light emitting device 1 was made of the Si substrate, but it may be made of a ceramic material such as alumina ($Al_2O_3$). When it is made of the ceramic material, the ferrule support 51, grating chip support 52, and groove 53 can be formed by machining. Particularly, machining such as dicing can be employed for formation of the groove 53.

The second embodiment described the example of the gull-wing optical module in which the light emitting device 1 was sealed in the resin body, but a variety of housing methods can be applied to the light emitting device according to the present invention. It is also noted that the fitting portions of the optical module 10 in the second embodiment do not have to be limited to the type shown in FIG. 13 and can be selected in conformity with the optical connector.

In the third embodiment the optical transmitters 111–118 were provided with the optical modules of substantially the same structure as the optical module 10, but they may be configured to incorporate the light emitting device 1 in the first embodiment. In this configuration, the light emitting device 1 is mounted on a circuit board in each of the optical transmitters 111–118 and the optical fibers 111f–118f are optically coupled to the corresponding light emitting devices 1.

The light emitting device apparatus 80 in the fourth embodiment was constructed in the four-channel configuration using the optical fibers 82, grating chips 6, semiconductor optical amplifiers 3, and photodiodes 4 four each, but the light emitting device apparatus according to the present invention can be constructed in any multi-channel configuration such as 8-channel configuration or the like, without having to be limited to the four-channel configuration. The holding member 88 in the light emitting device apparatus 80 may be provided with fitting portions such as the fitting portions 36 of the optical module 10, for example.

As described above, the light emitting device of the present invention provides the light emitting device of structure capable of reducing the placement region of the pigtail fiber in mounting on the circuit board. According to the light emitting device and optical module of the present invention, grating chips with various Bragg reflection wavelengths can be produced with high mass productivity and light emitting devices with a variety of different lasing wavelengths are provided with high mass productivity.

It is apparent from the above description of the present invention that the present invention can be modified in various ways. It should be understood that such modifications are encompassed by the present invention without departing from the spirit and scope of the present invention and all improvements obvious to those skilled in the art are embraced in the scope of claims which follow.

What is claimed is:

1. A light emitting device comprising:
a grating chip having a first end face, a second end face, and a diffraction grating;
a semiconductor optical amplifier having a light emitting surface and a light reflecting surface and being optically coupled to the first end face of the grating chip;
a fiber stub component including an optical fiber having a pair of end faces and being optically coupled to the second end face of the grating chip, and a ferrule having a pair of end faces; and
a mount member having first, second, and third regions arranged along a predetermined axis, the mount member having a butt face provided between the second region and the third region so as to intersect with the predetermined axis,
wherein the first region of the mount member has a ferrule support extending along the predetermined axis and supporting the ferrule,
the second region has a grating chip support extending along the predetermined axis and supporting the grating chip,
the third region has a device support on which the semiconductor optical amplifier is mounted,
wherein the first end face of the grating chip is in contact with the butt face of the mount member, thereby forming an external cavity constituted by the diffraction grating of the grating chip and the light reflecting surface of the semiconductor optical amplifier, and
a translucent resin, filling a clearance between the grating chip and the semiconductor optical amplifier and a clearance between the grating chip and the optical fiber of the fiber stub component.

2. The light emitting device according to claim 1, wherein the mount member is made of a ceramic material.

3. The light emitting device according to claim 1, wherein the mount member is made of silicon.

4. An optical module comprising:
the light emitting device as set forth in claim 1; and
a housing for housing the light emitting device,
wherein a first end face of the ferrule is located outside the housing.

5. An optical module comprising:
the light emitting device as set forth in claim 1;
a lead frame on which the light emitting device is mounted and which has a plurality of lead terminals; and
a resin body sealing the light emitting device and the lead frame so that a first end face of the ferrule is located outside and so that the plurality of lead terminals project out.

6. A light emitting device apparatus comprising:
a plurality of grating chips each having a first end face, a second end face, and a diffraction grating;
a plurality of semiconductor optical amplifiers each having a light emitting surface and a light reflecting surface and each being optically coupled to the first end face of the respective grating chips;
a plurality of optical fibers each having a pair of end faces and each being optically coupled to the second end face of the respective grating chips; and
a mount member having first, second, and third regions arranged along a predetermined axis, the mount member having a butt face provided between the second region and the third region so as to intersect with the predetermined axis,
wherein the first region has a plurality of optical fiber supports supporting each of the optical fibers,
the second region has a plurality of grating chip supports supporting the respective grating chips,
the third region has a mount region in which the plurality of semiconductor optical amplifiers are juxtaposed,
the first end face of each of the grating chips is in contact with the butt face of the mount member, and
a translucent resin, filling clearances between the grating chips and the semiconductor optical amplifiers and clearances between the grating chips and the plurality of optical fibers.

7. The light emitting device apparatus according to claim 6, wherein each of the optical fibers has a first portion supported on the optical fiber support, and a second portion projecting out from the first region.

8. The light emitting device apparatus according to claim 7, wherein the plurality of optical fibers are held by a holding member for holding the plurality of optical fibers, in the second portion.

9. A light emitting device comprising:
a grating chip having a first end face, a second end face, and a diffraction grating, a distance between the first end face and the second end face being not more than 4 mm, and the diffraction grating being formed so as to have a length equal to half or more of the distance,
a semiconductor optical amplifier having a light emitting surface and a light reflecting surface and being optically coupled to the first end face of the grating chip,
a fiber stub component including an optical fiber having a pair of end faces and being optically coupled to the second end face of the grating chip, and a ferrule having a pair of end faces, and
a mount member having first, second, and third regions arranged along a predetermined axis, the mount member having a butt face provided between the second region and the third region so as to intersect with the predetermined axis, wherein the first region of the mount member has a ferrule support extending along the predetermined axis and supporting the ferrule, the second region has a grating chip support extending along the predetermined axis and supporting the grating chip, the third region has a deice support on which the semiconductor optical amplifier is mounted, the first end face of the grating chip is in contact with the butt face of the mount member, thereby an external cavity is constituted by the diffraction grating of the grating chip and the light reflecting surface of the semiconductor optical amplifier, the optical fiber of the fiber stub component extends beyond the end face of the ferrule to the second region of the mount member, and a translucent resin, filling a clearance between the grating chip and the semiconductor optical amplifier and a clearance between the grating chip and the optical fiber of the fiber stub component.

10. A light emitting device apparatus comprising:

a plurality of grating chips each having a first end face, a second end face, and a diffraction grating, a distance between the first end face and the second end face being not more than 4 mm, and the diffraction grating being formed so as to have a length equal to half or more of the distance, a plurality of semiconductor optical amplifiers each having a light emitting surface and a light reflecting surface and each being optically coupled to the first end face of the respective grating chips, a plurality of optical fibers each having a pair of end faces and each being optically coupled to the second end face of the respective grating chips; and a mount member having first, second, and third regions arranged along a predetermined axis, the mount member having a butt face provided between the second region and the third region so as to intersect with the predetermined axis, wherein the first region has a plurality of optical fiber supports supporting each of the optical fibers, the second region has a plurality of grating chip supports supporting the respective grating chips, the third region has a mount region in which the plurality of semiconductor optical amplifiers are juxtaposed, the first end face of the each of the grating chips is in contact with the butt face of the mount member, the plurality of optical fibers extend to the second region of the mount member, and a translucent resin, filling a clearance between the grating chips and the semiconductor optical amplifiers and a clearance between the grating chips and the plurality of optical fibers.

* * * * *